US012532595B2

(12) United States Patent
Yamaguchi

(10) Patent No.: US 12,532,595 B2
(45) Date of Patent: Jan. 20, 2026

(54) PHOTOELECTRIC CONVERSION ELEMENT

(71) Applicant: CANON KABUSHIKI KAISHA, Tokyo (JP)

(72) Inventor: Tomona Yamaguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 433 days.

(21) Appl. No.: 18/323,287

(22) Filed: May 24, 2023

(65) Prior Publication Data
US 2023/0389342 A1 Nov. 30, 2023

(30) Foreign Application Priority Data

May 27, 2022 (JP) .................................. 2022-086874

(51) Int. Cl.
| | | |
|---|---|---|
| H10K 30/35 | (2023.01) | |
| H10K 30/60 | (2023.01) | |
| H10K 30/86 | (2023.01) | |
| H10K 39/32 | (2023.01) | |
| H10K 39/38 | (2023.01) | |
| H10K 85/10 | (2023.01) | |
| H10K 85/30 | (2023.01) | |
| H10K 85/60 | (2023.01) | |
| B82Y 20/00 | (2011.01) | |
| B82Y 30/00 | (2011.01) | |

(52) U.S. Cl.
CPC ............. *H10K 30/35* (2023.02); *H10K 30/60* (2023.02); *H10K 30/86* (2023.02); *H10K 39/32* (2023.02); *H10K 39/38* (2023.02); *H10K 85/115* (2023.02); *H10K 85/30* (2023.02); *H10K 85/615* (2023.02); *H10K 85/654* (2023.02); *B82Y 20/00* (2013.01); *B82Y 30/00* (2013.01)

(58) Field of Classification Search
None
See application file for complete search history.

(56) References Cited

FOREIGN PATENT DOCUMENTS

| JP | 2009520358 A | 5/2009 |
| JP | 2016033983 A | 3/2016 |
| WO | 2019058448 A1 | 3/2019 |

*Primary Examiner* — Anthony Ho
(74) *Attorney, Agent, or Firm* — Canon U.S.A., Inc. IP Division

(57) ABSTRACT

A photoelectric conversion element includes a first electrode, a first interfacial layer, a photoelectric conversion layer, and a second electrode in this order, wherein the photoelectric conversion layer includes quantum dots and a first organic compound, the first organic compound satisfies Formula (1), an electron affinity of a material used for the first interfacial layer, an electron affinity of the quantum dots, and an electron affinity of the first organic compound satisfy Formulas (2) and (3):

$$E2 > E1 \quad (1)$$

E1 [eV]: energy at short-wavelength end of optical wavelength region detected by the photoelectric conversion element
E2 [eV]: band gap of the first organic compound $$E3 < E4 - 0.2 \quad (2)$$

$$E4 - 0.4 < E5 < E4 \quad (3)$$

E3 [eV]: electron affinity of material used for the first interfacial layer
E4 [eV]: electron affinity of the quantum dots
E5 [eV]: electron affinity of the first organic compound.

24 Claims, 7 Drawing Sheets

PHOTOELECTRIC CONVERSION ELEMENT

BACKGROUND OF THE INVENTION

Field of the Invention

The present disclosure relates to a photoelectric conversion element.

Description of the Related Art

When quantum dots having sensitivity in long-wavelength regions have large particle sizes and large surface areas, the quantum dots tend to undergo surface oxidation or aggregation. Thus, in photoelectric conversion elements using quantum dots for photosensitive layers, formation of the electron trap level or narrowing of the band gap results in a large dark current. In most of existing photo-detection devices using quantum dots, the photoelectric conversion films are composed only of quantum dots, which are structures that tend to cause aggregation of the quantum dots.

PCT Japanese Translation Patent Publication No. 2009-520358, International Publication No. 2019/058448, and Nature Materials 4 (2005) 138 disclose photoelectric conversion elements including a photoelectric conversion layer in which quantum dots are dispersed in a bulk semiconductor.

The related art disclosed in the above-described publications includes examples in which quantum dots are dispersed in bulk semiconductors. However, in each of the examples, the bulk semiconductor and the quantum dots have photoelectric conversion capabilities, and the photoelectric conversion efficiency in the long-wavelength region in which quantum dots alone have photosensitivity is suppressed due to flowing of carriers into quantum dots from the adjacent bulk semiconductor and recombination.

Thus, in photoelectric conversion elements using quantum dots for photoelectric conversion films having sensitivity in the long-wavelength region, a large dark current and low photoelectric conversion efficiency are disadvantageous.

SUMMARY OF THE INVENTION

The present disclosure provides a photoelectric conversion element and a photoelectric conversion device in which the dark current is reduced and the electron transport ability is improved to thereby increase the photoelectric conversion efficiency.

A photoelectric conversion element according to an embodiment of the present disclosure includes a first electrode, a first interfacial layer, a photoelectric conversion layer, and a second electrode disposed in this order, wherein the photoelectric conversion layer includes quantum dots and a first organic compound,
the first organic compound satisfies Formula (1) below, and an electron affinity of a material used for the first interfacial layer, an electron affinity of the quantum dots, and an electron affinity of the first organic compound satisfy Formulas (2) and (3) below:

$$E2 > E1 \qquad \text{Formula (1)}$$

E1 [eV]: an energy at a short-wavelength end of an optical wavelength region detected by the photoelectric conversion element E2 [eV]: a band gap of the first organic compound $$E3 < E4 - 0.2 \qquad \text{Formula (2)}$$

$$E4 - 0.4 < E5 < E4 \qquad \text{Formula (3)}$$

E3 [eV]: the electron affinity of the material used for the first interfacial layer
E4 [eV]: the electron affinity of the quantum dots
E5 [eV]: the electron affinity of the first organic compound.

Further features of the present disclosure will become apparent from the following description of exemplary embodiments with reference to the attached drawings.

DESCRIPTION OF THE EMBODIMENTS

Hereinafter, photoelectric conversion elements according to embodiments of the present disclosure will be described with reference to drawings. The embodiments are mere examples of the present disclosure and the values, shapes, materials, elements, positions and connections of elements, and the like in the embodiments do not limit the present disclosure. For example, in the embodiments, transistors, semiconductor regions, and the like will be described, but their conductivity types can be appropriately changed.

Figure 1:
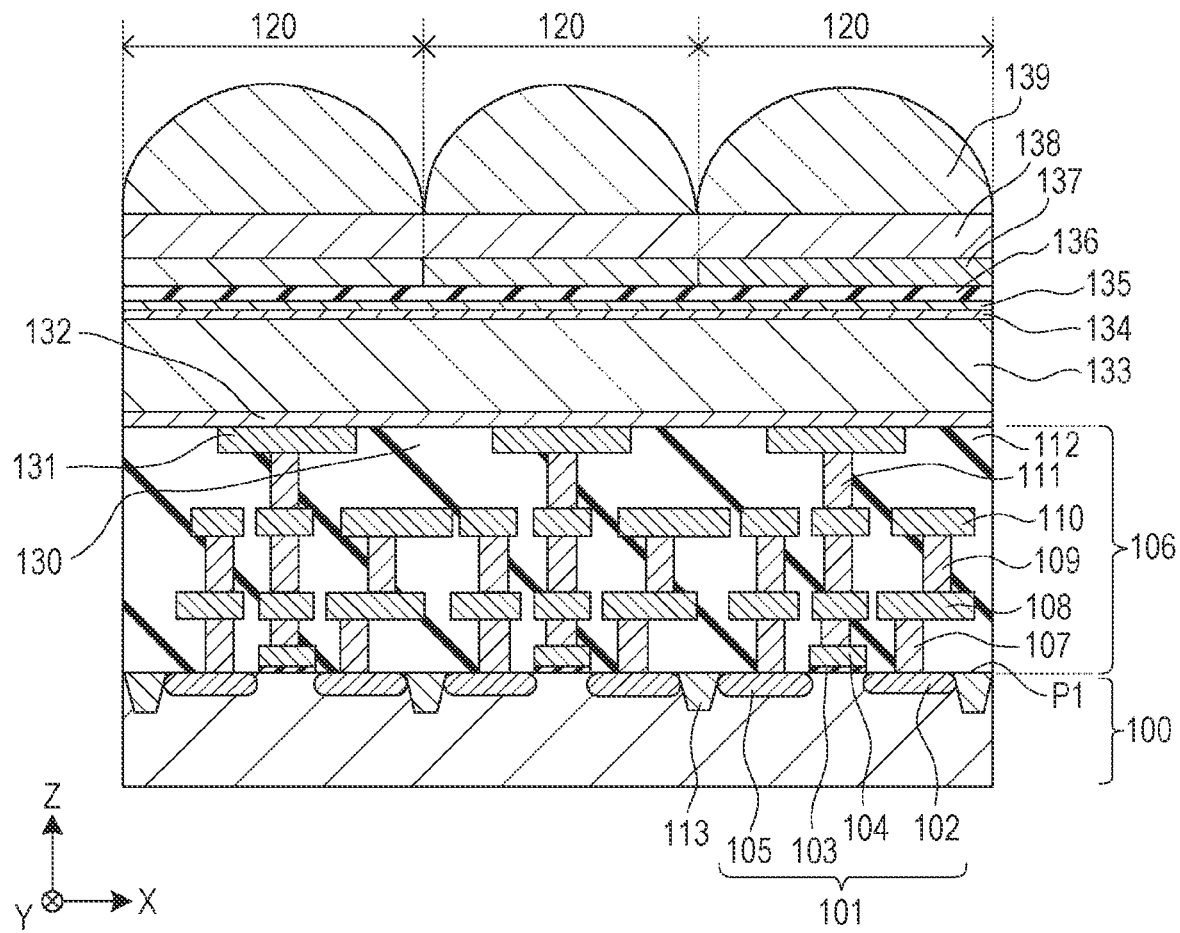
FIG. 1 is a schematic sectional view of a photoelectric conversion device according to an embodiment.

In drawings, elements denoted by the same reference signs are equivalent elements and will not be described again. Repeated patterns and elements understandable as equivalent elements may not be necessarily denoted by reference signs. Photoelectric conversion element and photoelectric conversion device FIG. 1 is a schematic sectional view of three unit cells 120 of a photoelectric conversion device. FIG. 1 illustrates a section taken along a plane including the Z direction serving as the vertical direction and the X direction. The unit cells 120 may also be referred to as pixels or subpixels. The unit cells 120 include equivalent circuit configurations and each include at least one photoelectric conversion element. This embodiment describes a configuration in which each of the unit cells 120 includes a single photoelectric conversion element. The photoelectric conversion element is provided by appropriately selecting the material for a photoelectric conversion layer 133 described later. The circuit configurations of the unit cells of the photoelectric conversion device are appropriately set. Hereinafter, the photoelectric conversion device in FIG. 1 will be described in detail.

Substrate 100

In FIG. 1, a substrate 100 has a main surface P1. The material for the substrate 100 may be glass or ceramic; in this embodiment, the substrate 100 is a semiconductor substrate formed of a silicon single crystal. The substrate 100 includes a transistor 101 and an element isolation region 113. The transistor 101 includes a source-drain region 102, a gate insulating film 103, a gate electrode 104, and a source-drain region 105. The gate electrode 104 is disposed on the main surface P1. The gate insulating film 103 is positioned between the gate electrode 104 and the main surface P1. The source-drain region 102 and the source-drain region 105 are disposed within the substrate 100.

Wiring structure 106

On the main surface P1 of the substrate 100, a wiring structure 106 is disposed. The wiring structure 106 includes a contact plug 107, a wiring layer 108, a via plug 109, a wiring layer 110, a via plug 111, and an insulating film 112. The insulating film 112, which is not illustrated in detail in FIG. 1, may be a multilayer film. Such members can be formed from ordinary semiconductor materials.

Electrodes (First Electrode 131 and Second Electrode 135)

The photoelectric conversion device in FIG. 1 includes a first electrode 131 and a second electrode 135. The first electrode 131 may be an electron collection electrode, a cathode, or a negative electrode. The second electrode 135 may be a hole collection electrode, an anode, or a positive electrode. One of the first electrode 131 and the second electrode 135 may be an upper electrode while the other may be a lower electrode; in FIG. 1, the first electrode 131 is a lower electrode and the second electrode 135 is an upper electrode.

On the substrate 100, the second electrode 135 is disposed. The second electrode 135 is disposed so as to continuously extend through the three unit cells 120. In this embodiment, the second electrode 135 has a flat upper surface and a flat lower surface.

The first electrode 131 is disposed between the substrate 100 and the second electrode 135. At least one first electrode 131 is included in each of the unit cells 120. This embodiment illustrates the configuration in which a single first electrode 131 is disposed in each of the unit cells 120. An isolation region 130 is disposed between a plurality of first electrodes 131. The isolation region 130 may be the insulating film 112 of the wiring structure 106.

The first electrode 131 and the second electrode 135 can be formed of any material that provides electrodes having conductivity. Examples of the constituent material for the electrodes include metals such as platinum, gold, silver, aluminum, chromium, nickel, copper, titanium, and magnesium, alloys of the foregoing, nitrides of the foregoing, metal oxides such as indium oxide and tin oxide, and compound oxides of the foregoing (such as ITO and IZO).

Examples of the constituent material for the electrodes include conductive particles of, for example, carbon black, fullerene, carbon nanotubes, or graphene, and conductive composite materials in which such materials are dispersed in matrixes such as polymer binders. Such electrode constituent materials may be used alone or in appropriate combination of two or more thereof in an appropriate ratio. In the photoelectric conversion element, at least a pair of (two) electrodes are disposed; between the pair of electrodes, the photoelectric conversion layer 133 is disposed. In this case, at least one of the pair of electrodes can be transparent. Such a transparent electrode transmits light to be absorbed by the photoelectric conversion layer 133.

The electrodes have functions of collecting electrons and holes generated within the photoelectric conversion layer 133. Thus, the electrode constituent materials can be, of the above-described materials, constituent materials suitable for collecting electrons and holes. Examples of the material for the second electrode 135 include materials suitable for collecting holes, for example, materials having high work function such as Au and ITO. On the other hand, examples of the material for the first electrode 131 include materials suitable for collecting electrons, for example, materials having low work function such as Al, titanium, and titanium nitride. Of these, titanium or titanium nitride can be used. For such an electrode, its thickness, which is not particularly limited and is appropriately determined in accordance with the material used, the target conductivity, the target transparency, or the like, is ordinarily about 10 nm or more and about 10 μm or less.

Interfacial layers (first interfacial layer 132 and second interfacial layer 134)

The photoelectric conversion device according to an embodiment of the present disclosure includes, between the first electrode 131 and the photoelectric conversion layer 133, a first interfacial layer 132. The photoelectric conversion device can include, between the photoelectric conversion layer 133 and the second electrode 135, a second interfacial layer 134. The photoelectric conversion device according to this embodiment includes the first interfacial layer 132 and the second interfacial layer 134. The first interfacial layer 132 may be a hole blocking interfacial layer or a hole blocking layer. The second interfacial layer 134 may be an electron blocking interfacial layer or an electron blocking layer.

The first interfacial layer 132 is disposed between the photoelectric conversion layer 133 and the plurality of first electrodes 131. FIG. 1 illustrates the two interfacial layers separated from each other. The second interfacial layer 134 is disposed between the photoelectric conversion layer 133 and the second electrode 135.

Such an interfacial layer is a layer for ensuring electric isolation, in terms of a part of the carriers, namely holes or electrons, between an electrode and the photoelectric conversion layer 133. The interfacial layer is also a layer for ensuring conduction, in terms of the other part of the carriers, between the electrode and the photoelectric conversion layer 133. For this reason, the interfacial layer can also be referred to as a carrier injection blocking layer. The interfacial layer can also function as an adhesion layer and can suppress film separation due to low wettability between the electrode and the photoelectric conversion layer 133. From the viewpoint of suppressing film separation, the interfacial layer can be formed over the whole surface of the photoelectric conversion layer 133 in order to have an increased contact area with the photoelectric conversion layer 133. Ordinarily, a layer that blocks electrons and conducts holes alone (electron blocking interfacial layer) can be formed on the electrode that collects holes (positive electrode) while a layer that blocks holes and conducts electrons alone (hole blocking interfacial layer) can be formed on the electrode that collects electrons (negative electrode).

The first interfacial layer 132 (hole blocking interfacial layer) is disposed to have a function of blocking holes separated from the photoelectric conversion layer 133 and transporting electrons to the first electrode 131 (negative electrode). In order to provide the function, its material can have properties of, for example, high electron mobility, high electrical conductivity, low electron injection barrier to the negative electrode, and low electron injection barrier from the photoelectric conversion layer 133 to the hole blocking interfacial layer. A configuration configured to emit light from the negative-electrode-side portion may be employed or reflected light may be effectively used from the negative-electrode-side portion; in such cases, the material further having high transmittance is employed. The first interfacial layer 132 is disposed, to thereby increase the photoelectric conversion efficiency EQE and reduce dark electrons.

From such viewpoints, examples of the material for the hole blocking interfacial layer include N-type semiconductor materials such as inorganic semiconductors such as titanium oxide $TiO_2$, zinc oxide ZnO, indium-gallium-zinc oxide IGZO ($InGaZnO_4$), tungsten oxide $WO_3$, and molybdenum oxide $MoO_3$. In particular, for oxide-based inorganic semiconductors, film-formation conditions may be adjusted or formed films may be processed so as to control the degree of oxidation to thereby easily change the electrical conductivity.

The material for the second interfacial layer 134 (electron blocking interfacial layer) can be a material that efficiently transport holes generated in the photoelectric conversion layer 133 to the second electrode 135 (positive electrode). The material can have properties such as high hole mobility, high electrical conductivity, low hole injection barrier to the positive electrode, and low hole injection barrier from the photoelectric conversion layer 133 to the electron blocking interfacial layer. In a case where light is introduced through the electron blocking interfacial layer into the photoelectric conversion layer 133, the material for the electron blocking interfacial layer can be a highly transparent material. In a case where a visible light is introduced into the photoelectric conversion layer 133, the transparent material for the electron blocking interfacial layer can be a material having a transmittance for the visible light of ordinarily 60% or more, particularly 80% or more. From such viewpoints, examples of the material for the electron blocking interfacial layer include inorganic semiconductors such as molybdenum oxide $MoO_3$ and nickel oxide NiO and organic materials including a triarylamine moiety such as a triphenylamine moiety or a fluorene moiety.

The second interfacial layer 134 is disposed, to thereby increase the photoelectric conversion efficiency EQE and reduce dark electrons.

Non-limiting examples of the organic material compound including a triarylamine moiety or a fluorene moiety and used for the second interfacial layer 134 include the following H-1 to H-4.

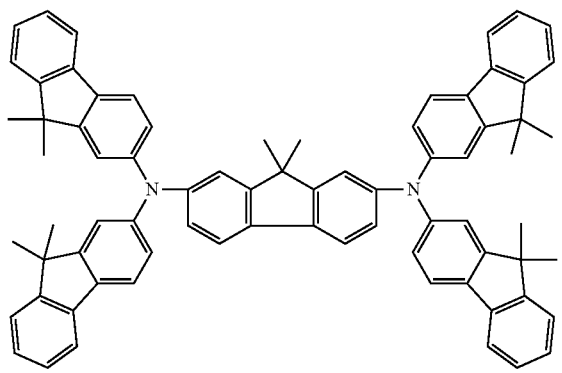

H-1

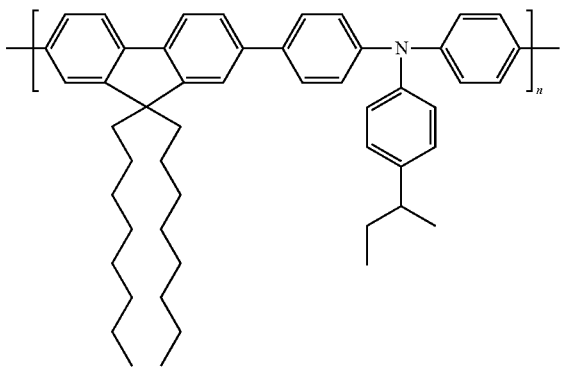

H-2

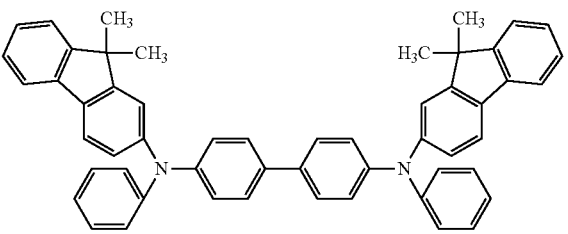

H-3

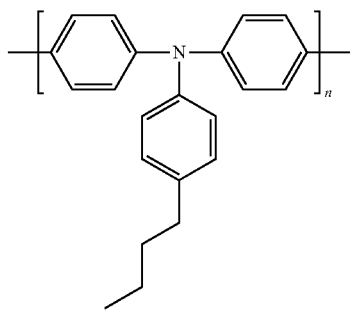

H-4

For the thicknesses of the interfacial layers, in particular, the second interfacial layer 134 is formed so as to have a thickness of about 1 nm or more and about 100 nm or less. In such an interfacial layer, an electric field can be applied in the thickness direction to control injection of charges while charges are freely movable in a horizontal direction with respect to the thickness direction. When the interfacial layer is a film having a high electrical conductivity, leakage current or crosstalk between unit cells can occur.

The material used for the second interfacial layer and the quantum dots can satisfy Formula (7) below:

$$\mu h_{HTL} > \mu h_{QD} \qquad \text{Formula (7)}$$

$\mu h_{HTL}$ [cm²/Vs]: a hole mobility of the material used for the second interfacial layer $\mu h_{QD}$ [cm²/Vs]: a hole mobility of the quantum dots in the photoelectric conversion layer.

When Formula (7) is satisfied, accumulation of holes is reduced in the interface between the photoelectric conversion layer and the second interfacial layer and the hole transport ability is improved, so that the number of dark electrons is reduced.

Photoelectric Conversion Layer 133

The photoelectric conversion layer 133 is disposed between each of the first electrodes 131 and the second electrode 135. The photoelectric conversion layer 133 includes quantum dots and a first organic compound. The photoelectric conversion layer 133 is configured to perform photoelectric conversion and the first electrodes 131 are configured to read out signals based on charges generated by photoelectric conversion.

The material for the photoelectric conversion layer 133 may be an inorganic material or an organic material. For example, for the photoelectric conversion layer, quantum dots being the group of nanoparticles formed of amorphous silicon, an organic semiconductor, or a compound semiconductor material may be used. Examples of the organic semiconductor include fullerene (C60), coumarin 6 (C6), rhodamine 6G (R6G), quinacridone, phthalocyanine-based semiconductors, and naphthalocyanine-based semiconductors. In this embodiment, the photoelectric conversion layer 133 includes quantum dots such as colloidal quantum dots being nanoparticles of a compound semiconductor material.

The colloidal quantum dots constituting the photoelectric conversion layer 133 include nanoparticles (having an average particle size of 0.5 nm or more and less than 100 nm). The material for the nanoparticles is, for example, an ordinary semiconductor crystal such as a group IV semiconductor, a group III-V compound semiconductor, a group II-VI compound semiconductor, or a compound semiconductor that is a combination of three or more selected from the group consisting of group II, III, IV, V, and VI elements. Specific examples include PbS, PbSe, PbTe, InN, InAs, InP, InSb, InAs, InGaAs, CdS, CdSe, CdTe, Ge, CuInS, CuInSe, CuInGaSe, and Si, which are semiconductor materials having relatively narrow band gaps. These are also referred to as semiconductor quantum dots. Such quantum dots contain at least one of such semiconductor quantum dot materials. The quantum dots may have a core-shell structure in which a semiconductor quantum dot material forms a core and the semiconductor quantum dot material is covered with a cover compound. In the case of quantum dots having sizes similar to or smaller than the exciton Bohr radii intrinsic to individual semiconductor materials, the quantum size effect is provided, so that the sizes enable the desired band gap, in other words, control of the optical absorption wavelength.

In particular, the semiconductor quantum dot material is desirably PbS, PbSe, PbTe, InP, InAs, CdS, CdSe, or CdTe, more desirably PbS or PbSe from the viewpoint of ease of synthesis of the quantum dots. PbS has an exciton Bohr radius of about 18 nm and the quantum dots desirably have an average particle size of 2 nm or more and 15 nm or less. The particle sizes of quantum dots are measured using a transmission electron microscope. The average particle size of quantum dots can be set to 2 nm or more, to thereby facilitate, in synthesis of the quantum dots, crystal growth of the quantum dots. The crystal growth of the quantum dots can be controlled, to thereby select the wavelength region for which the photoelectric conversion element has sensitivity.

The method for producing the photoelectric conversion layer 133 formed as a quantum dot film including the group of nanoparticles is not particularly limited. The thickness of the photoelectric conversion layer 133 is not particularly limited, but is, from the viewpoint of providing high optical absorption, preferably 10 nm or more, more preferably 50 nm or more. From the viewpoint of ease of production, the thickness of the photoelectric conversion layer 133 can be 800 nm or less.

In the quantum dots, the surfaces of the nanoparticles can be coordinated with an organic ligand, preferably at least one organic ligand species selected from the group consisting of 1,4-benzenedithiol and 1,3-benzenedithiol. In the quantum dots, to the surfaces of the nanoparticles, at least one halogen selected from the group consisting of iodine, chlorine, and bromine can be added. Such a material can be selected to thereby protect defects in the surfaces of the quantum dots, to improve the heat resistance. For example, a heat resistance to 170° C. or more enables formation of on-chip color filters or on-chip microlenses, which can provide colors or higher sensitivity.

In some embodiments according to the present disclosure, "quantum dots" can have a structure in which an organic ligand and a halogen ligand are coordinated to the surfaces of nanoparticles.

Figure 2:
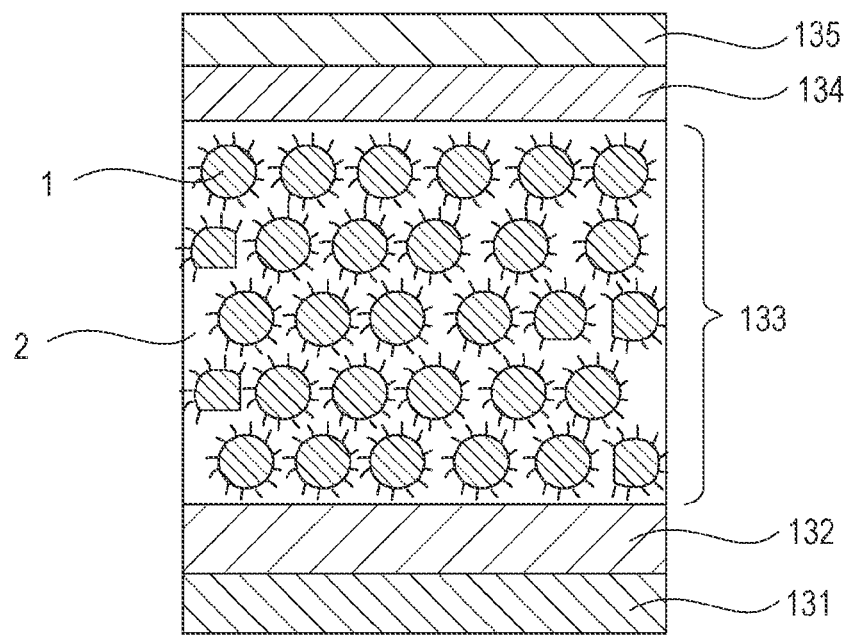
FIG. 2 is a schematic sectional view of a photoelectric conversion element according to an embodiment.

FIG. 2 is a schematic sectional view of a photoelectric conversion element according to this embodiment. As illustrated in FIG. 2, the photoelectric conversion layer 133 includes quantum dots 1 and a first organic compound 2. In a photoelectric conversion element including a photoelectric conversion layer constituted by quantum dots alone, gaps are present between spherical quantum dots (Nature Nanotech. vol 7, 577-582 (2012)). In the case of forming the photoelectric conversion layer using large-particle-size quantum dots having absorption in the near-infrared light region, compared with small-particle-size quantum dots, the photoelectric conversion layer is sparsely packed and has more gaps. In particular, in the case of PbS quantum dots, as the particle sizes increase, the ratio of S atoms in the surfaces of the quantum dots increases and surfaces not protected by the ligand are exposed and tend to undergo oxidation and aggregation, which is known. For this reason, as illustrated in FIG. 2, the first organic compound 2 is added so as to fill the gaps, to thereby suppress oxidation and aggregation of the quantum dots 1, to prevent increase in the dark current.

In the photoelectric conversion element using quantum dots, the value of the band gap of the quantum dots can be designed to thereby select the wavelength range being the target of sensitivity. For example, in the external quantum efficiency illustrated in FIG. 7, the sensitivity covers the long-wavelength-side region to about 1650 nm. The limit of the sensitivity on the long-wavelength side is governed by the band gap of the quantum dots, which is, in the case illustrated in FIG. 7, about 0.75 eV. When the band gap of quantum dots is decreased, aggregation of the material becomes disadvantageous in the related art and the products cannot be supplied with stability. Embodiments according to the present disclosure enable designing of the band gap of quantum dots to less than 1 eV or even a value of less than 0.9 eV, to thereby provide a photoelectric conversion element in which the long-wavelength-side sensitivity region is expanded from that of the related art.

The first organic compound satisfies Formula (1) below; the electron affinity of the material used for the first interfacial layer, the electron affinity of the quantum dots, and the electron affinity of the first organic compound satisfy Formulas (2) and (3) below:

$$E2 > E1 \quad \text{Formula (1)}$$

E1 [eV]: the energy at the short-wavelength end of the optical wavelength region detected by the photoelectric conversion element E2 [eV]: the band gap of the first organic compound $$E3 < E4 - 0.2 \quad \text{Formula (2)}$$

$$E4 - 0.4 < E5 < E4 \quad \text{Formula (3)}$$

E3 [eV]: the electron affinity of the material used for the first interfacial layer E4 [eV]: the electron affinity of the quantum dots
E5 [eV]: the electron affinity of the first organic compound.

When Formulas (1), (2), and (3) are satisfied, the number of dark electrons is reduced and the photoelectric conversion efficiency (EQE) is also increased. In the case of an organic compound that does not satisfy Formula (1), charge trapping and recombination tend to occur in low-energy quantum dots, reduction in the dark current is not observed and the photoelectric conversion efficiency decreases.

Figure 4A:
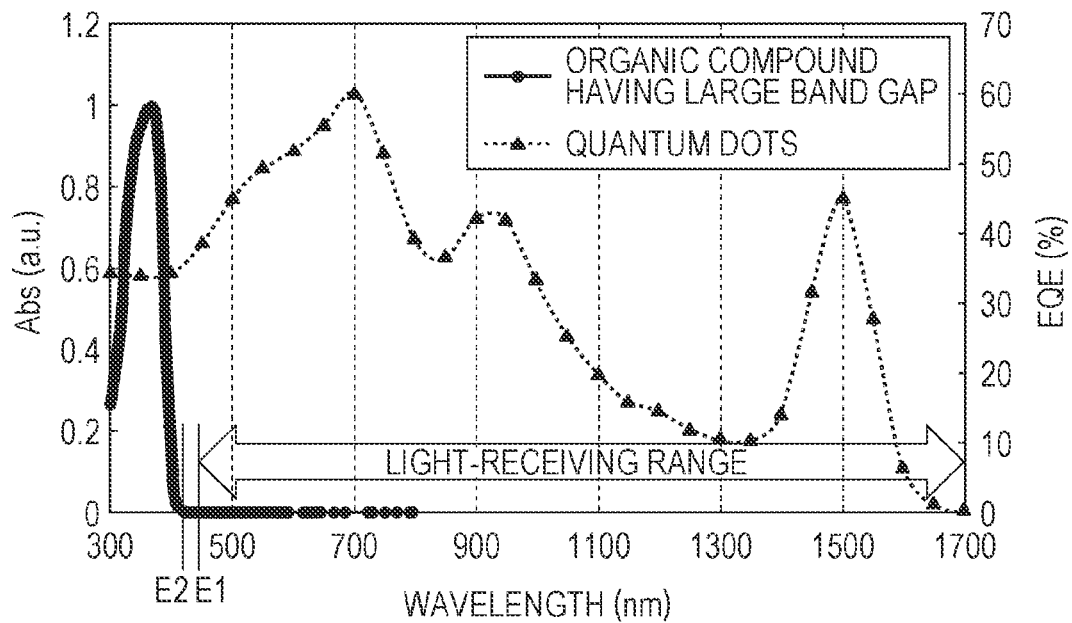
FIGS. 4A and 4B illustrate examples of the photoelectric conversion efficiency spectrum of quantum dots and the absorption spectrum of the organic compound included in the photoelectric conversion layer.
Figure 4B:
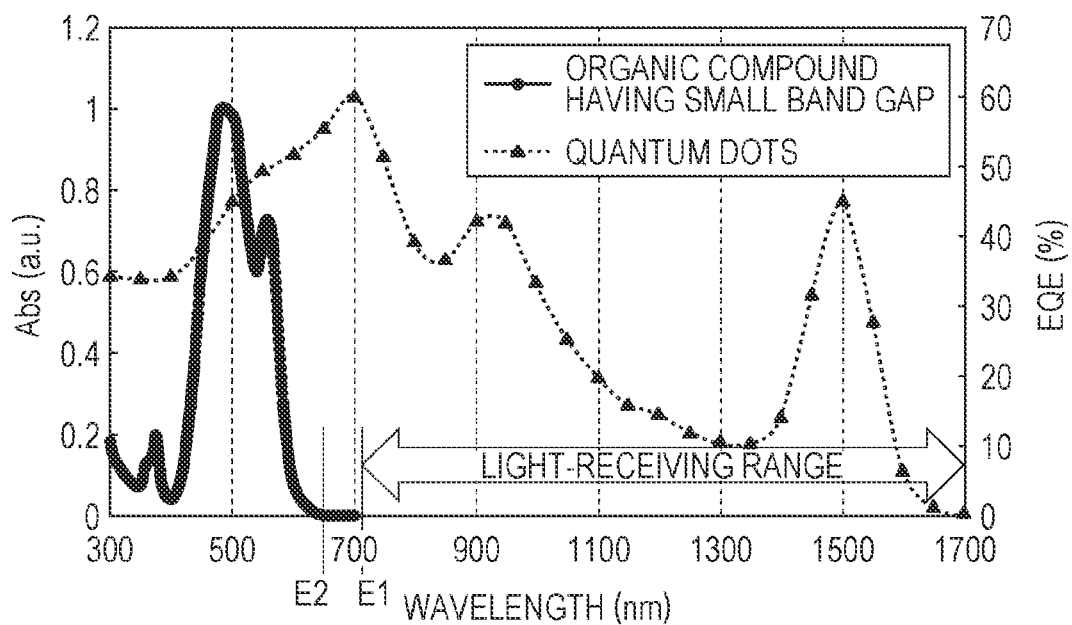

FIGS. 4A and 4B illustrate examples in which, for the photoelectric conversion layer of this embodiment, the photoelectric conversion efficiency spectrum of the quantum dots and the absorption spectrum of the organic compound are superimposed. FIGS. 4A and 4B indicate the positions of wavelengths corresponding to E1 and E2 in Formula (1). The light-receiving range of the photoelectric conversion element can be freely set, from the visible light to the near-infrared light, in accordance with the application. In the case of setting, as the light-receiving range, the region from the visible light to the near-infrared light, as illustrated in FIG. 4A, a compound that has a large band gap E2 and exhibits absorption in the short wavelength region alone is used. Alternatively, in the case of setting the near-infrared light region alone as the light-receiving range, as illustrated in FIG. 4B, a compound that has a smaller band gap E2 than that in FIG. 4A and exhibits absorption in the visible region can also be used, so that the range of choices of such compounds is broadened.

The organic compound that satisfies Formula (3) contributes to improvement in the electron transport ability in the photoelectric conversion element, to provide sufficiently the effect of addressing the dark current. The quantum dots that satisfy Formula (2) have an electron affinity E4, which has a large difference from the electron affinity E3 of the first interfacial layer, so that, during transport of electrons to the electrode, electrons may accumulate at the interface between the first interfacial layer and the photoelectric conversion layer. The photoelectric conversion layer can be formed by mixing with the organic compound that satisfies Formula (3), to thereby suppress accumulation of electrons at the interface between the first interfacial layer and the photoelectric conversion layer. Thus, the electron transport ability can be improved, to achieve reduction in the dark current and increase in the photoelectric conversion efficiency.

The first organic compound can be a compound that satisfies Formula (4) below.

$$E3 > E5 - 0.2 \quad \text{Formula (4)}$$

In the case of the organic compound that satisfies Formula (4), the electron transfer barrier from the organic compound to the first interfacial layer tends not to become high and the electron transport ability is improved.

The first organic compound, in particular, a compound that satisfies Formula (5) below can satisfy Formula (6) below.

$$E5 < E4 - 0.2 \quad \text{Formula (5)}$$

$$\mu e_{org1} > \mu e_{QD} \quad \text{Formula (6)}$$

$\mu e_{org1}$ [cm$^2$/Vs]: the electron mobility of the first organic compound in the photoelectric conversion layer
$\mu e_{QD}$ [cm$^2$/Vs]: the electron mobility of the quantum dots in the photoelectric conversion layer When Formula (5) is satisfied, there is a large electron-affinity difference between the quantum dots and the organic compound, so that the interaction between the quantum dots and the organic compound within the photoelectric conversion layer becomes weak, and the electron transport ability may degrade. When the $\mu e_{org}/\mu e_{QD}$ ratio of the electron mobility ($\mu e_{org}$) of the organic compound to the electron mobility ($\mu e_{QD}$) of the quantum dots is high, degradation of the electron transport ability can be prevented. $\mu e_{org}/\mu e_{QD}$ is preferably 2 or more, more preferably 100 or more.

The band gap of quantum dots decreases as the particle sizes increase. In this case, there is a tendency in which the ionization potential of the quantum dots substantially does not change while the electron affinity alone increases. Thus, in the case of using quantum dots having a band gap of less than 1 eV, there is a large electron-affinity difference between the first interfacial layer and the quantum dots and addition of the first organic compound to the photoelectric conversion layer provides considerably the effect of improving the electron transport ability. In such cases of using quantum dots having band gaps in the region of less than 1 eV, embodiments according to the present disclosure are particularly effective for improving the electron transport ability, reducing the dark current, and increasing the photoelectric conversion efficiency.

Figure 3:
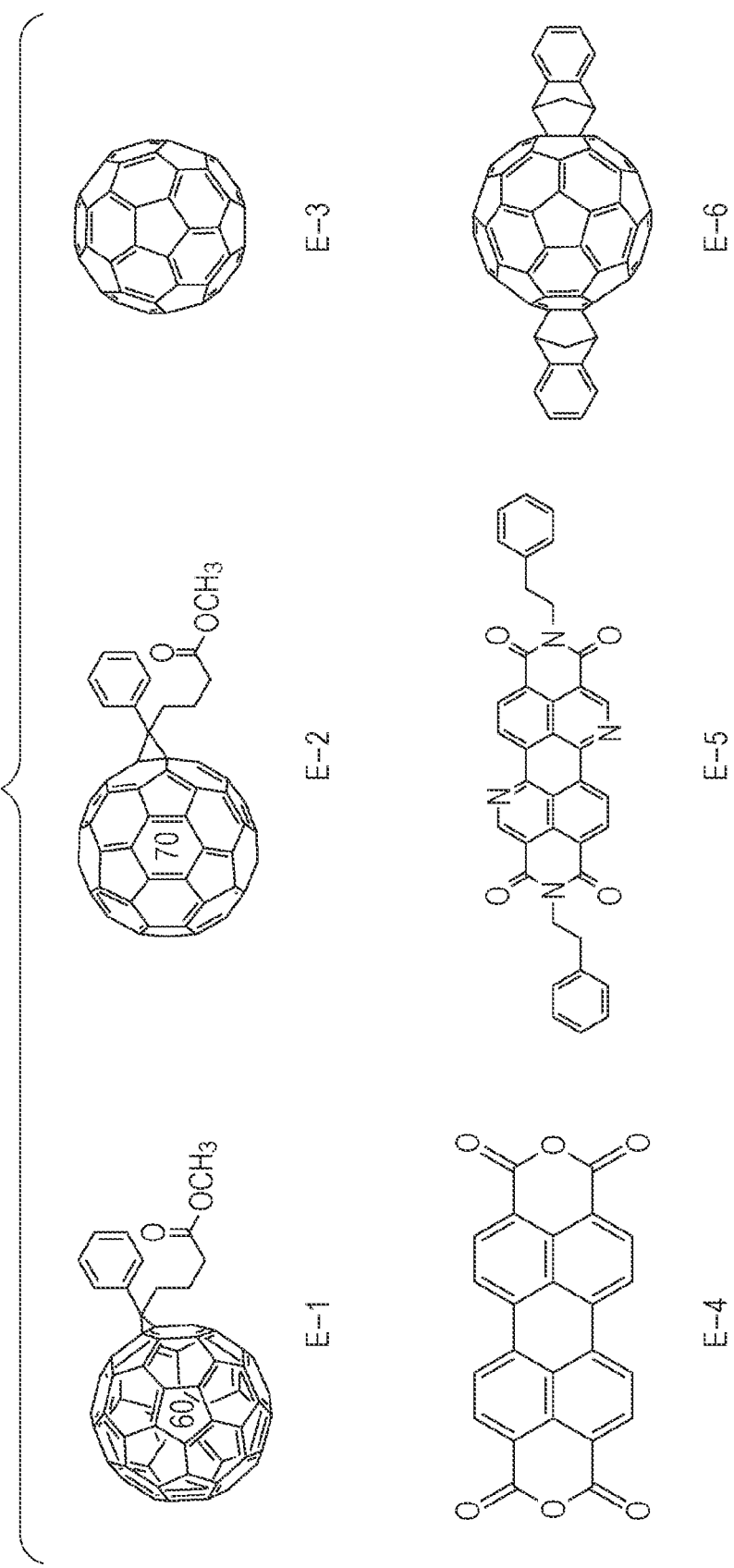
FIG. 3 illustrates non-limiting examples of the first organic compound.

Non-limiting examples of the first organic compound include fullerene derivative, Perylene tetracarboxylic dianhydride derivative, and hexacosa decaene tetrone derivative. It is exemplified as a fullerene C60, a fullerene C70, Perylene tetracarboxylic dianhydride, and Bis(2-phenyl-ethyl)-tetrazaheptacyclohexacosa-decaene-tetrone. More specifically, E-1 to E-6 are shown in FIG. 3.

The first organic compound content relative to 100 mass % of the total amount of the quantum dots and the first organic compound in the photoelectric conversion layer can be 0.1 mass % or more and less than 10 mass %.

Note that, during formation of the photoelectric conversion layer, uncoordinated and unreacted organic ligands may not be completely washed off and remain. Such unreacted organic ligands that do not satisfy Formulas (1) and (3) above are not the first organic compound of the photoelectric conversion layer. For example, 1,4-benzenedithiol and 1,3-benzenedithiol satisfy Formula (1) above, but do not satisfy Formula (3) above.

The photoelectric conversion layer can further include the second organic compound. The second organic compound is a compound that does not satisfy Formula (3') below corresponding to Formula (3) above and can satisfy Formula (3") below.

$$E4 - 0.4 < E5' < E4 \quad \text{Formula (3')}$$

$$E4 - 1.5 > E5' \quad \text{Formula (3")}$$

E4 [eV]: the electron affinity of the quantum dots
E5' [eV]: the electron affinity of the second organic compound The second organic compound can satisfy Formula (1') below corresponding to Formula (1) above.

$$E2' > E1 \quad \text{Formula (1')}$$

E1 [eV]: the energy at the short-wavelength end of the optical wavelength region detected by the photoelectric conversion element
E2' [eV]: the band gap of the second organic compound The second organic compound can satisfy Formula (4') below corresponding to Formula (4) above.

$$E3 > E5' - 0.2 \quad \text{Formula (4')}$$

E3 [eV]: the electron affinity of the material used for the first interfacial layer When the second organic compound is included, the first organic compound can have an electron transport ability and the second organic compound can have a hole transport ability. More specifically, Formulas (6) and (8) below can be satisfied.

$$\mu e_{org1} > \mu e_{QD} \quad \text{Formula (6)}$$

$$\mu h_{org2} > \mu h_{QD} \quad \text{Formula (8)}$$

$\mu e_{org1}$ [cm²/Vs]: the electron mobility of the first organic compound in the photoelectric conversion layer $\mu e_{QD}$ [cm²/Vs]: the electron mobility of the quantum dots in the photoelectric conversion layer $\mu h_{org2}$ [cm²/Vs]: the hole mobility of the second organic compound in the photoelectric conversion layer $\mu h_{QD}$ [cm²/Vs]: the hole mobility of the quantum dots in the photoelectric conversion layer Addition of an electron-transport organic compound to the photoelectric conversion layer increases the electron mobility within the layer. However, in the case of using, for the quantum dots, a material having a low hole mobility, the photoelectric conversion layer has a large difference between the hole mobility and the electron mobility and holes may accumulate at the interface between the photoelectric conversion layer and the second interfacial layer. Thus, an electron-transport material and a hole-transport material can be mixed together, to thereby promote transport of carriers in the photoelectric conversion layer, to reduce the dark current and to increase the photoelectric conversion efficiency.

The first organic compound and the second organic compound may each have a constant concentration within the photoelectric conversion layer or may each have a concentration gradient in the entirety or a portion of the photoelectric conversion layer. The concentration of the first organic compound in the photoelectric conversion layer can increase to the first interfacial layer. The concentration of the second organic compound in the photoelectric conversion layer can decrease to the first interfacial layer. For example, the concentration of the first organic compound in the photoelectric conversion layer may increase to the first interfacial layer while the concentration of the second organic compound in the photoelectric conversion layer may decrease to the first interfacial layer. Alternatively, the concentration of the first organic compound in the photoelectric conversion layer may be constant while the concentration of the second organic compound in the photoelectric conversion layer may decrease to the first interfacial layer. Alternatively, the concentration of the second organic compound in the photoelectric conversion layer may be constant while the concentration of the first organic compound in the photoelectric conversion layer may increase to the first interfacial layer.

The second organic compound can include at least one selected from the group consisting of the following compounds.

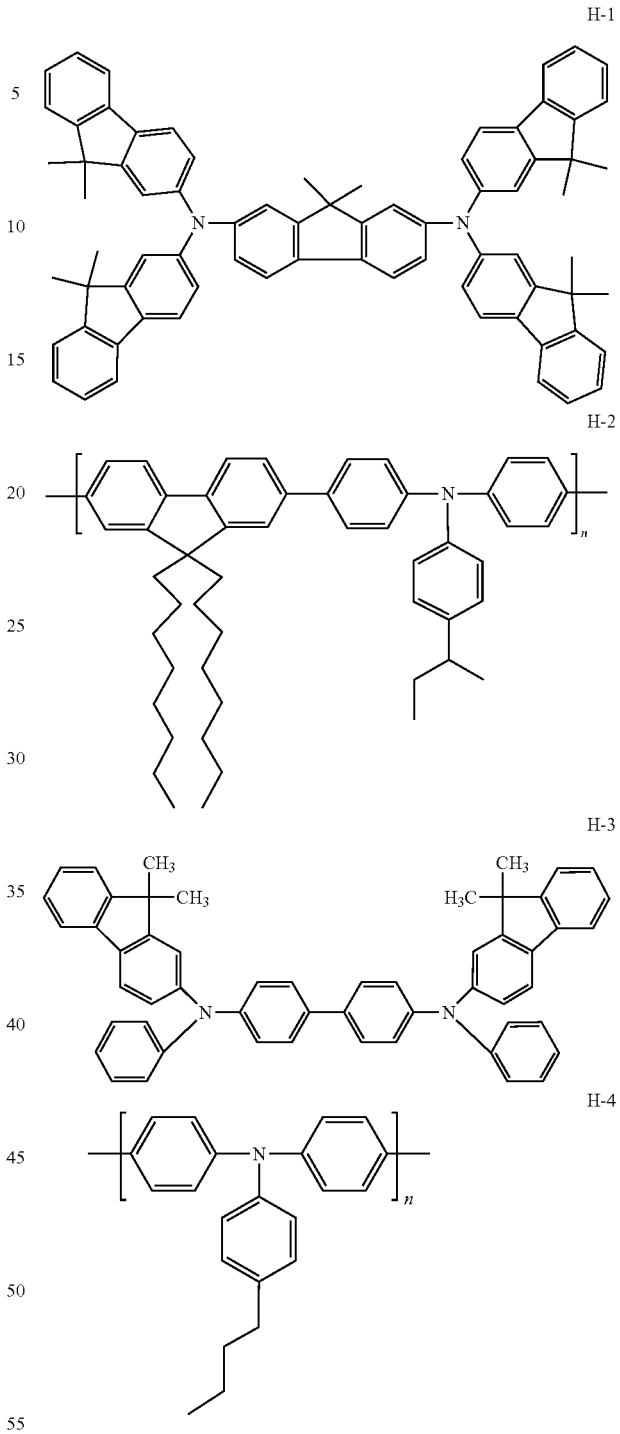

The second organic compound content relative to 100 mass % of the total amount of the quantum dots and the second organic compound in the photoelectric conversion layer can be 0.1 mass % or more and less than 10 mass %.

The second organic compound can satisfy Formula (9) below.

$$IP_{org2} \leq Ip_{QD} + 0.2 \quad \text{Formula (9)}$$

$Ip_{org2}$ [eV]: the ionization potential of the second organic compound $Ip_{QD}$ [eV]: the ionization potential of the quantum dots The second organic compound can satisfy Formula (10) below.

$$E5' < E3 - 0.2 \qquad \text{Formula (10)}$$

E5' [eV]: the electron affinity of the second organic compound

E3 [eV]: the electron affinity of the material used for the first interfacial layer Other Layers In FIG. 1, on the second electrode 135, an insulating layer 136, a color filter layer 137, a planarization layer 138, and a lens layer 139 are disposed in this order in the Z direction. The insulating layer 136 can function as a protective layer or a sealing layer. The color filter layer 137 includes color filters corresponding to a plurality of colors. For example, a single unit cell 120 includes a single color filter. The planarization layer 138 is disposed on the color filter layer 137 and has a flat upper surface. The lens layer 139 includes a plurality of microlenses. For example, a single unit cell 120 includes a single microlens.

Method for Producing Photoelectric Conversion Element and Photoelectric Conversion Device The method for producing the photoelectric conversion element and the photoelectric conversion device will be described with reference to FIG. 1.

Substrate 100

First, a step of preparing a substrate 100 in which a wiring structure 106 is formed will be described. On the substrate 100 being a semiconductor substrate, an element isolation region 113 and a transistor 101 are formed. The element isolation region 113 has, for example, an STI structure (Shallow Trench Isolation). The transistor 101 is, for example, an N-type MOS transistor and is constituted by a gate electrode 104, a gate insulating film 103, a source-drain region 102, and a source-drain region 105. The source-drain regions 102 and 105 are constituted by N-type semiconductor regions.

Wiring Structure 106

Subsequently, the wiring structure 106 is formed on the substrate 100. A contact plug 107, a via plug 109, and a via plug 111 are formed of, for example, at least one metallic material selected from the group consisting of Al, Cu, W, Ti, and TiN, and can have, in this embodiment, a multilayer structure of titanium, titanium nitride, and tungsten. A wiring layer 108 and a wiring layer 110 are formed of, for example, at least one metallic material selected from the group consisting of Al, Cu, W, Ti, and TiN, and can have, in this embodiment, a multilayer structure of tantalum and copper.

An insulating film 112 is, for example, a film of silicon oxide or silicon nitride.

First Electrode 131

Subsequently, on the via plug 111, a first electrode 131 is formed. The first electrode 131 is formed so as to have a thickness of about 10 nm or more and about 500 nm or less. After the formation of the first electrode 131, the insulating film 112 may be formed. In this case, a planarization process is performed such that the upper surfaces of the insulating film 112 and the first electrode 131 are at the same level. The planarization process is performed by etching or the CMP (Chemical Mechanical Polishing) method. For such production methods, ordinary semiconductor processes can be applied.

First Interfacial Layer 132

Subsequently, on the insulating film 112 and the first electrode 131, a film serving as a first interfacial layer 132 is formed. The film serving as the first interfacial layer 132 is formed of the above-described material and is deposited by, for example, a vapor deposition process or a sputtering process so as to have a thickness of about 1 nm or more and about 100 nm or less. When the first interfacial layer 132 has a small thickness, the voltage applied to the photoelectric conversion layer 133 can be decreased.

On the other hand, when the first interfacial layer 132 has a large thickness, tunneling of holes due to the tunnel effect can be reduced and film defects such as pinholes can be prevented. For example, the thickness of the first interfacial layer 132 is made larger than the surface irregularities of the first electrode 131, to thereby reduce the defects of the first interfacial layer 132. From such viewpoints, the thickness of the first interfacial layer 132 can be appropriately set.

An example in which the material for the first interfacial layer 132 is titanium oxide ($TiO_2$) is described here. For example, a sputtering apparatus is used to apply, to a $TiO_2$ target, the predetermined RF power, argon-gas flow rate, and chamber pressure to form a $TiO_2$ film having the desired thickness.

Photoelectric Conversion Layer 133

Subsequently, a photoelectric conversion layer 133 is formed. Specifically, quantum dots being nanoparticles of a compound semiconductor and an organic compound (the first organic compound and, as needed, the second organic compound) are deposited over the whole surface of the substrate, to form the photoelectric conversion layer 133. An example in which the quantum dots are formed of lead sulfide (PbS) is described here. First, the quantum dots of lead sulfide (PbS) are synthesized as "oleic-acid-etc.-protected quantum dots" including, as a ligand, oleic acid or the like having a large molecular length, and applied onto the substrate. However, in this state, the intervals between the quantum dots are large and the conductivity of photocarriers generated by irradiation with light is poor, so that the photoelectric conversion performance tends to be low. Thus, ligand exchange from the ligand having a large molecular length such as oleic acid to an organic ligand having a small molecular length such as 1,4-benzenedithiol can be performed.

Note that the organic ligand is not limited to 1,4-benzenedithiol and may be at least one ligand species selected from ligands including organic compounds including ethanedithiol, 1,3-benzenedithiol, 4-methylbenzoic acid, benzenediamine, and dibenzenediamine. In particular, in the case of ligands including a benzene ring such as benzenedithiol, which have boiling points of more than 200° C., even at high temperatures of 140° C. or more, detachment-decomposition or evaporation of the ligand from the surfaces of the quantum dots is suppressed, so that the quantum dot film has high heat resistance. Alternatively, as the ligand, 3-mercaptopropionic acid can be selected; however, from the viewpoint of heat resistance, a ligand including a benzene ring can be selected.

After the ligand exchange between the organic ligands, an N,N-dimethylformamide mixture solution of lead iodide and an organic compound is used to perform coordination of an iodine ligand to the quantum dots and addition of the organic compound to the photoelectric conversion layer. The addition of the organic compound may be performed separately from the coordination of the iodine ligand.

On the quantum dot film (having a thickness of 40 nm to 60 nm) after the ligand exchange, the formation of an oleic-acid-protected quantum dot film, the ligand exchange, the addition of the organic compound, and rinsing can be repeated to thereby form an iodine-added 1,4-benzenedithiol quantum dot film having a desired thickness.

Second Interfacial Layer 134

Subsequently, on the photoelectric conversion layer 133, a film serving as a second interfacial layer 134 is formed. The film serving as the second interfacial layer 134 is formed of the above-described material and is deposited by, for example, a vapor deposition process or a sputtering process so as to have a thickness of about 1 nm or more and about 100 nm or less. When the second interfacial layer 134 has a small thickness, the voltage applied to the photoelectric conversion layer 133 can be decreased. On the other hand, when the second interfacial layer 134 has a large thickness, tunneling of electrons due to the tunnel effect can be reduced and film defects such as pinholes can be prevented. For example, the thickness of the second interfacial layer 134 is made larger than the surface irregularities of the second electrode 135, to thereby reduce the defects of the second interfacial layer 134. From such viewpoints, the thickness of the second interfacial layer 134 can be appropriately set.

Second Electrode 135

Subsequently, a second electrode 135 is formed. Specifically, for example, ITO, IZO, or ZnO is deposited on the second interfacial layer 134, to form the second electrode 135.

Annealing Process

The formed device is subjected to an annealing process in order to increase the photoelectric conversion efficiency or to improve carrier injection. The annealing temperature, which is set in accordance with the heat resistance of the materials used for the layers, can be at least lower than the lowest glass transition temperature of the organic compounds used. In order to exhibit sufficiently high resistance to the temperatures applied in the processes, the organic materials desirably have glass transition temperatures of at least 100° C. or more.

Other Layers

Subsequently, an insulating layer 136, a color filter layer 137, a planarization layer 138, and a lens layer 139 are sequentially formed. For the processes of producing these layers, ordinary processes in production of semiconductor devices can be applied.

Application Examples of Photoelectric conversion Element

Photoelectric Conversion Devices such as Light-Receiving Element and Image Sensor A photoelectric conversion element according to an embodiment of the present disclosure may be applied to photoelectric conversion devices such as light-receiving elements and image sensors. Such a light-receiving element includes a photoelectric conversion element, a readout circuit configured to read out charges from the photoelectric conversion element, and a signal processing circuit configured to receive the charges from the readout circuit and to perform signal processing. Such an image sensor includes a plurality of pixels and a signal processing circuit connected to the pixels, wherein the pixels include a photoelectric conversion element and a readout circuit connected to the photoelectric conversion element.

Image Pickup Apparatus

A photoelectric conversion element according to an embodiment of the present disclosure can be applied to an image pickup apparatus. The image pickup apparatus includes an optical system including a plurality of lenses and a light-receiving element configured to receive light having been transmitted by the optical system, wherein the light-receiving element includes a photoelectric conversion element. Specific examples of the image pickup apparatus include digital still cameras and digital video cameras.

Figure 5:
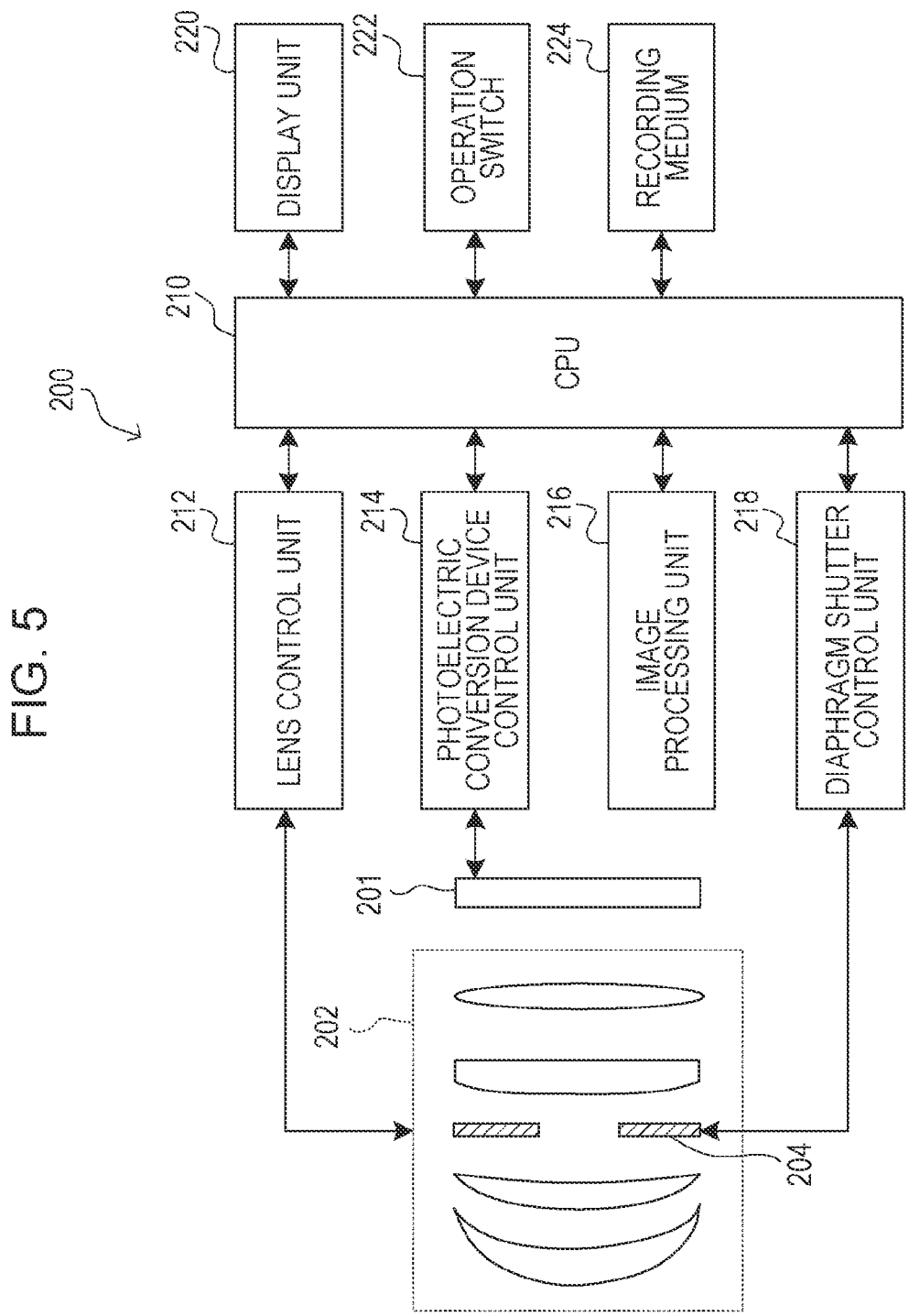
FIG. 5 illustrates an example of an image pickup system including a photoelectric conversion element according to an embodiment of the present disclosure.

FIG. 5 illustrates an example of an image pickup system including a photoelectric conversion element according to an embodiment of the present disclosure. Referring to FIG. 5, an image pickup system 200 includes a photoelectric conversion device 201, an image pickup optical system 202, a CPU 210, a lens control unit 212, a photoelectric conversion device control unit 214, an image processing unit 216, a diaphragm shutter control unit 218, a display unit 220, an operation switch 222, and a recording medium 224.

The image pickup optical system 202 is an optical system configured to form an optical image of the subject and includes a lens group and a diaphragm 204, for example. The diaphragm 204 has a function of adjusting its aperture diameter to thereby adjust the amount of light during image pickup and also has a function of serving as an exposure time adjustment shutter during still image pickup. The lens group and the diaphragm 204 are held so as to be movable back and forth in the optical axis direction; the lens group and the diaphragm 204 are operated together to thereby provide a variable magnification function (zooming function) or a focus adjustment function. The image pickup optical system 202 may be a part of the image pickup system or may be an image pickup lens that can be attached to the image pickup system.

The photoelectric conversion device 201 is disposed such that the image pickup plane is disposed in the image space of the image pickup optical system 202. The photoelectric conversion device 201 is a photoelectric conversion device according to an embodiment of the present disclosure and includes a CMOS sensor (pixel unit) and its peripheral circuit (peripheral circuit region). In the photoelectric conversion device 201, pixels including a plurality of photoelectric conversion units are two-dimensionally arranged and color filters are disposed so as to correspond to these pixels, to thereby constitute a two-dimensional single color sensor. The photoelectric conversion device 201 is configured to subject the subject image formed by the image pickup optical system 202, to photoelectric conversion and configured to output as image signals or focus detection signals.

The lens control unit 212 is configured to control driving of back and forth of the lens group of the image pickup optical system 202 to vary magnification or to adjust the focus, and is constituted by a circuit and a processing device configured to provide such functions. The diaphragm shutter control unit 218 is configured to vary the aperture size of the diaphragm 204 (variable f-number) to adjust the amount of light during image pickup, and is constituted by a circuit and a processing device configured to provide such functions.

The CPU 210 is a control device disposed within the camera and configured to perform various controls of the camera body, and includes a mathematical operation unit, a ROM, a RAM, an A/D converter, a D/A converter, and a communication interface circuit, for example. The CPU 210 is configured to control, on the basis of the computer program stored in the ROM or the like, operations of units within the camera, to perform a series of image pickup operations such as AF including detection of the focus state (focus detection) in the image pickup optical system 202, image pickup, image processing, and recording. The CPU 210 also serves as a signal processing unit.

The photoelectric conversion device control unit 214 is configured to control operations of the photoelectric conversion device 201 and configured to subject signals outputted from the photoelectric conversion device 201 to A/D conversion to transmit the signals to the CPU 210, and is constituted by a circuit and a control device configured to provide such functions. Alternatively, the A/D conversion function may be provided by the photoelectric conversion device 201. The image processing unit 216 is configured to subject the A/D-converted signals to image processing such as y conversion or color interpolation to generate image signals, and is constituted by a circuit and a control device configured to provide such functions. The display unit 220 is a display device such as a liquid crystal display (LCD) and is configured to display information about the capture mode of the camera, a preview image before capture, a post-view image after capture, the focusing state during focus detection, and the like. The operation switch 222 is constituted by a power switch, a release (capture trigger) switch, a zoom operation switch, a capture mode selection switch, and the like. The recording medium 224 is configured to record captured images and the like and may be a built-in medium in the image pickup system or may be a medium detachably mounted, such as a memory card.

As has been described, the image pickup system 200 to which the photoelectric conversion device 201 according to an embodiment of the present disclosure is applied is provided, to thereby achieve a high-performance image pickup system.

Moving Object

A photoelectric conversion element according to an embodiment of the present disclosure may be applied to a moving object. The moving object includes a body including an image pickup apparatus and a moving unit configured to move the body. Specific examples include automobiles, aircraft, watercraft, and drones. The image pickup apparatus is disposed in the moving object and the surroundings may be captured to support operations of the moving object. The body can be formed of metal or carbon fiber. The carbon fiber may be formed of polycarbonate, for example. Examples of the moving unit include tires, floating by magnetism, and mechanisms of vaporizing fuel and injecting the fuel.

Figure 6A:
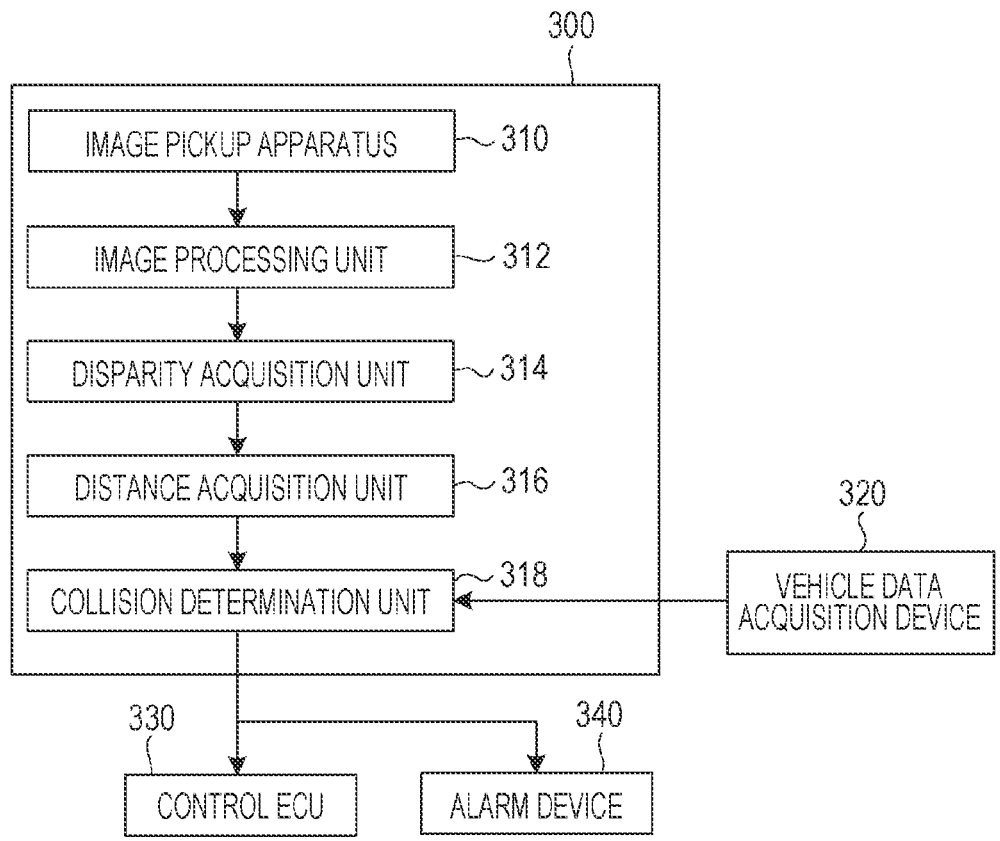
FIGS. 6A and 6B illustrate the configurations of an image pickup system and a moving object according to embodiments.
Figure 6B:
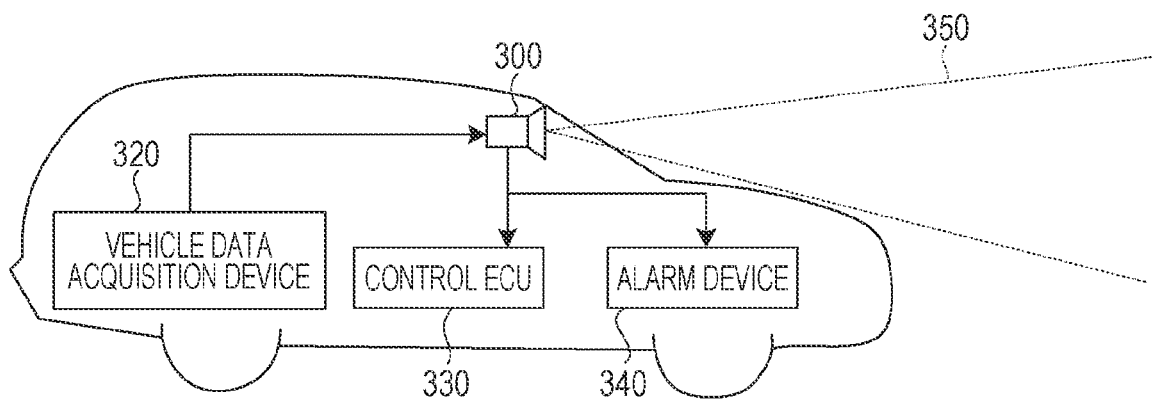

FIG. 6A and FIG. 6B illustrate configurations of an image pickup system and a moving object according to this embodiment.

FIG. 6A illustrates an example of an image pickup system 300 relating to an on-vehicle camera. The image pickup system 300 includes an image pickup apparatus 310. The image pickup apparatus 310 is the image pickup apparatus according to this embodiment. The image pickup system 300 includes an image processing unit 312 being a processing device configured to subject, to image processing, a plurality of image data acquired by the image pickup apparatus 310. The image pickup system 300 includes a disparity acquisition unit 314, which is a processing device configured to calculate, on the basis of a plurality of image data acquired from the image pickup apparatus 310, disparity (the phase difference in the disparity images). The image pickup system 300 includes a distance acquisition unit 316, which is a processing device configured to calculate, on the basis of the calculated disparity, the distance to the object, and a collision determination unit 318, which is a processing device configured to determine, on the basis of the calculated distance, the probability of collision. The disparity acquisition unit 314 and the distance acquisition unit 316 are examples of data acquisition units configured to acquire data such as data of distance to the object. Specifically, the distance data is data about disparity, defocusing amount, or the distance to the object, for example. The collision determination unit 318 may determine, on the basis of any one of these in the distance data, the probability of collision. The above-described various processing devices may be implemented in specially designed hardware or may be implemented in general-purpose hardware configured to perform mathematical operations on the basis of software modules. The processing devices may be implemented in, for example, FPGA (Field Programmable Gate Array) or ASIC (Application Specific Integrated Circuit) or may be implemented in combinations of these.

The image pickup system 300 is connected to a vehicle data acquisition device 320 and is configured to acquire vehicle data such as vehicle speed, yaw rate, and steering angle. The image pickup system 300 is connected to a control ECU 330, which is a control device configured to output, on the basis of the determination result in the collision determination unit 318, control signals that apply braking power to the vehicle. Specifically, the control ECU 330 is an example of the moving object control unit configured to control the moving object on the basis of distance data. The image pickup system 300 is also connected to an alarm device 340 configured to give, on the basis of the determination result in the collision determination unit 318, an alarm to the driver. For example, when the determination result in the collision determination unit 318 indicates a high probability of collision, the control ECU 330 performs, for example, braking, deceleration, or lowering of the output of the engine to control the vehicle in order to avoid collision or to reduce damage. The alarm device 340 gives warning to the user by, for example, raising an alarm such as a sound alarm, displaying alarm information on the display of a car navigation system or the like, or vibrating the seatbelt or the steering wheel.

In this embodiment, the surroundings of the vehicle, for example, the forward region or the backward region is captured using the image pickup system 300.

FIG. 6B illustrates an image pickup system 300 in the case of capturing the vehicle forward region (image pickup region 350).

The vehicle data acquisition device 320 is configured to direct to operate the image pickup system 300 to pickup images. The image pickup apparatus according to this embodiment is used as the image pickup apparatus 310, so that the image pickup system 300 according to this embodiment can have further improved accuracy of distance measurement.

The example in which control is performed so as to prevent collision with another vehicle has been described; in addition, the image pickup system can be applied to control of automatic driving of following another vehicle and control of automatic driving of lane keeping, for example. Furthermore, the image pickup system can be applied not only to vehicles such as automobiles, but also to, for example, moving objects (transportation apparatuses) such as watercraft, aircraft, and industrial robots. The moving objects (transportation apparatuses) include moving devices that are various moving units such as engines, motors, wheels, and propellers.

In addition, the image pickup system can be applied not only to moving objects, but also to wide-ranging apparatuses using object recognition such as Intelligent Transport Systems (ITS).

Included Features

The disclosure of the embodiments include the following features.

Feature 1

A photoelectric conversion element comprising a first electrode, a first interfacial layer, a photoelectric conversion layer, and a second electrode disposed in this order, wherein the photoelectric conversion layer includes quantum dots and a first organic compound, the first organic compound satisfies Formula (1) below, and an electron affinity of a material used for the first interfacial layer, an electron affinity of the quantum dots, and an electron affinity of the first organic compound satisfy Formulas (2) and (3) below:

$$E2>E1 \quad \text{Formula (1)}$$

E1 [eV]: an energy at a short-wavelength end of an optical wavelength region detected by the photoelectric conversion element E2 [eV]: a band gap of the first organic compound $$E3<E4-0.2 \quad \text{Formula (2)}$$

$$E4-0.4<E5<E4 \quad \text{Formula (3)}$$

E3 [eV]: the electron affinity of the material used for the first interfacial layer E4 [eV]: the electron affinity of the quantum dots E5 [eV]: the electron affinity of the first organic compound.

Feature 2

The photoelectric conversion element according to Feature 1, wherein the electron affinity E3 of the material used for the first interfacial layer and the electron affinity E5 of the first organic compound satisfy Formula (4) below:

$$E3>E5-0.2 \quad \text{Formula (4)}.$$

Feature 3

The photoelectric conversion element according to Feature 1 or 2, wherein the quantum dots have a band gap of less than 1 eV.

Feature 4

The photoelectric conversion element according to any one of Features 1 to 3, wherein, when the electron affinity E5 of the first organic compound and the electron affinity E4 of the quantum dots satisfy Formula (5) below, Formula (6) below is satisfied:

$$E5<E4-0.2 \quad \text{Formula (5)}$$

$$\mu e_{org1} > \mu e_{QD} \quad \text{Formula (6)}$$

$\mu e_{org1}$ [cm$^2$/Vs]: an electron mobility of the first organic compound in the photoelectric conversion layer $\mu e_{QD}$ [cm$^2$/Vs]: an electron mobility of the quantum dots in the photoelectric conversion layer.

Feature 5

The photoelectric conversion element according to any one of Features 1 to 4, wherein the quantum dots include nanoparticles and the nanoparticles contain PbS, PbSe, PbTe, InP, InAs, CdS, CdSe, or CdTe.

Feature 6

The photoelectric conversion element according to any one of Features 1 to 5, wherein the quantum dots include nanoparticles and surfaces of the nanoparticles are coordinated with at least one organic ligand species selected from the group consisting of 1,4-benzenedithiol and 1,3-benzenedithiol.

Feature 7

The photoelectric conversion element according to any one of Features 1 to 6, wherein the quantum dots include nanoparticles and, to surfaces of the nanoparticles, at least one halogen selected from the group consisting of iodine, chlorine, and bromine is added.

Feature 8

The photoelectric conversion element according to any one of Features 1 to 7, wherein the first interfacial layer contains at least one selected from the group consisting of TiO$_2$, ZnO, InGaZnO$_4$, MoO$_3$, and WO$_3$.

Feature 9

The photoelectric conversion element according to any one of Features 1 to 8, wherein the first electrode contains titanium or titanium nitride.

Feature 10

The photoelectric conversion element according to any one of Features 1 to 9, further comprising a second interfacial layer between the photoelectric conversion layer and the second electrode.

Feature 11

The photoelectric conversion element according to Feature 10, wherein the second interfacial layer contains at least one selected from the group consisting of MoO$_3$, NiO, and an organic material including a triarylamine moiety or a fluorene moiety.

Feature 12

The photoelectric conversion element according to Feature 10 or 11, wherein a material used for the second interfacial layer and the quantum dots satisfy Formula (7) below:

$$\mu h_{HTL} > \mu h_{QD} \quad \text{Formula (7)}$$

$\mu h_{HTL}$ [cm$^2$/Vs]: a hole mobility of the material used for the second interfacial layer $\mu h_{QD}$ [cm$^2$/Vs]: a hole mobility of the quantum dots in the photoelectric conversion layer.

Feature 13

The photoelectric conversion element according to any one of Features 1 to 12, wherein the first organic compound contains at least one selected from the group consisting of E-1 to E-6 above.

Feature 14

The photoelectric conversion element according to any one of Features 1 to 13, wherein the photoelectric conversion layer further includes a second organic compound.

Feature 15

The photoelectric conversion element according to Feature 14, satisfying Formulas (6) and (8) below:

$$\mu e_{org1} > \mu e_{QD} \quad \text{Formula (6)}$$

$$\mu h_{org2} > \mu h_{QD} \quad \text{Formula (8)}$$

$\mu e_{org1}$ [cm$^2$/Vs]: an electron mobility of the first organic compound in the photoelectric conversion layer $\mu e_{QD}$ [cm$^2$/Vs]: an electron mobility of the quantum dots in the photoelectric conversion layer $\mu h_{org2}$ [cm$^2$/Vs]: a hole mobility of the second organic compound in the photoelectric conversion layer $\mu h_{QD}$ [cm$^2$/Vs]: a hole mobility of the quantum dots in the photoelectric conversion layer.

Feature 16

The photoelectric conversion element according to Feature 14 or 15, wherein a concentration of the first organic compound in the photoelectric conversion layer increases to the first interfacial layer, and a concentration of the second organic compound in the photoelectric conversion layer decreases to the first interfacial layer.

Feature 17

The photoelectric conversion element according to Feature 14 or 15, wherein a concentration of the first organic compound in the photoelectric conversion layer is constant, and a concentration of the second organic compound in the photoelectric conversion layer decreases to the first interfacial layer.

Feature 18

The photoelectric conversion element according to Feature 14 or 15, wherein a concentration of the second organic compound in the photoelectric conversion layer is constant, and a concentration of the first organic compound in the photoelectric conversion layer increases to the first interfacial layer.

Feature 19

The photoelectric conversion element according to any one of Features 14 to 18, wherein the second organic compound contains at least one selected from the group consisting of H-1 to H-4 above.

Feature 20

The photoelectric conversion element according to any one of Features 1 to 19, further comprising, on the first electrode or the second electrode, at least one layer selected from the group consisting of a sealing layer, a lens layer, and a color filter layer.

Feature 21

An image sensor comprising a plurality of pixels and a signal processing circuit connected to the pixels, wherein the pixels include the photoelectric conversion element according to any one of Features 1 to 20 and a readout circuit connected to the photoelectric conversion element.

Feature 22

A light-receiving element comprising the photoelectric conversion element according to any one of Features 1 to 20, a readout circuit configured to read out charges from the photoelectric conversion element, and a signal processing circuit configured to receive charges from the readout circuit and to perform signal processing.

Feature 23

An image pickup apparatus comprising an optical system including a plurality of lenses and a light-receiving element configured to receive light having been transmitted by the optical system, wherein the light-receiving element includes the photoelectric conversion element according to any one of Features 1 to 20.

Feature 24

A moving object comprising a body including an image pickup apparatus and a moving unit configured to move the body, wherein the image pickup apparatus is the image pickup apparatus according to Feature 23.

EXAMPLES

Hereinafter, Examples according to the present disclosure will be described; however, the present disclosure is not limited to the scope of the Examples. In the Examples, photoelectric conversion elements described below were produced and evaluated in terms of element characteristics. Note that the Examples are provided to evaluate characteristics of elements of various combinations to thereby demonstrate the effect of reducing the dark current. Thus, the materials, thicknesses, and layer configurations of the layers within the elements below are mere examples and hence the present disclosure is not limited to the Examples disclosed here.

Example 1

The photoelectric conversion element of this Example is formed in the following manner: on a Si substrate, an electron collection electrode (first electrode), a hole blocking layer (first interfacial layer), a photoelectric conversion layer, an electron blocking layer (second interfacial layer), and a hole collection electrode (second electrode) are stacked in this order. The light-receiving range is set from 700 nm to 1700 nm. Specifically, at the short-wavelength end (700 nm) of the optical wavelength region detected by the photoelectric conversion element, energy E1=1.77 eV. The electron affinity (E4), the electron mobility ($\mu e_{QD}$), and the hole mobility ($\mu h_{QD}$) of the quantum dots in this Example are described in Table 1.

TABLE 1

| E4 [eV] | $\mu e_{QD}$ [cm$^2$/Vs] | $\mu h_{QD}$ [cm$^2$/Vs] |
|---|---|---|
| 4.4 | 1.3E−03 | 4.0E−05 |

(1) Production of Photoelectric Conversion Element

First, a Si substrate was prepared in which a wiring layer and an insulating layer were stacked and contact holes were formed at positions corresponding to pixels so as to extend through openings in the insulating layer to establish connections from the wiring layer. From the contact holes, wires were extended to the substrate edges to form pad regions. A film of a TiN electrode was formed so as to overlap the contact hole regions and patterned into a desired pattern to form a TiN electrode (electron collection electrode) having an area of 0.64 mm$^2$. The TiN electrode was formed so as to have a film thickness of 60 nm.

On the Si substrate having the electron collection electrode, an element was, in the above-described order, formed of constituent materials and at thicknesses in Table 2. The element formed was subjected to an annealing process at 100° C. for 1 hour.

TABLE 2

| | Constituent material | Thickness [nm] |
|---|---|---|
| Electron collection electrode | TiN | 60 |
| Hole blocking layer | TiO$_2$ | 50 |
| Photoelectric conversion layer | Nanoparticles: PbS<br>Ligand: 1,4-benzenedithiol, PbI$_2$<br>First organic compound: E-1 | 200 |
| Electron blocking layer | MoO3 | 15 |
| Hole collection electrode | ITO | 40 |

Specifically, the methods of forming the hole blocking layer, the photoelectric conversion layer, the electron blocking layer, and the hole collection electrode are as follows.

Hole Blocking Layer (First Interfacial Layer)

A sputtering apparatus was used to apply, to a TiO$_2$ target, conditions of an RF power of 500 W, an argon gas flow rate of 100 sccm, and a chamber pressure of 0.5 Pa to form a TiO$_2$ film having a thickness of 50 nm.

Photoelectric Conversion Layer

Synthesis Step

Into a three-neck flask, 892 mg of lead oxide (PbO), 40 mL of octadecene, and 4 mL of oleic acid were placed and the flask was set in an oil bath. The oil bath was set at 90° C.; the atmosphere within the flask was a nitrogen atmosphere; in order to prevent oxidation of the quantum dots during reaction, nitrogen flow was performed at a flow rate of 0.5 L/min. Stirring was performed for 30 or more minutes until the pale yellow solution initially placed was turned to a transparent solution. Separately, within a glove box having a nitrogen atmosphere, 20 mL of a 1.9 mM bistrimethylsilyl sulfide solution in octadecene serving as a sulfur source was prepared in a syringe. This sulfur source was rapidly added to the solution having been turned transparent within the three-neck flask. After 1 minute elapsed from the addition, the three-neck flask was removed from the oil bath and left to cool for 2 hours to room temperature, when the subsequent purification step was performed. Note that the solution was black and generation of lead sulfide (PbS) quantum dots having surfaces protected by oleic acid was confirmed.

Purification Step

The dispersion liquid of quantum dots in octadecene obtained in the synthesis step was moved from the three-neck flask to a centrifuge tube. To this, a polar solvent, acetone was added, so that the quantum dots were no longer dispersed with stability in octadecene; this was centrifuged using a centrifugal machine to precipitate the quantum dots. Note that the centrifugal conditions were 17,000 rpm and 20 minutes. From the centrifugal machine, the centrifuge tube was taken out, transparent acetone in the supernatant was removed and subsequently, to the quantum dots precipitated in the bottom of the centrifuge tube, a nonpolar solvent, toluene was added. After the addition of toluene, the centrifuge tube was shaken to thereby disperse again the quantum dots in toluene. To this toluene dispersion liquid, acetone was added again; the liquid was centrifuged at 15,000 rpm for 5 minutes to cause precipitation. This step of precipitation using acetone and re-dispersion using toluene was repeated three times, to thereby purify the quantum dot dispersion liquid, to obtain a toluene dispersion liquid of quantum dots.

Step of Preparing Coating Liquid

To the toluene dispersion liquid of quantum dots obtained in the purification step, acetone was added and centrifugation was similarly performed to cause precipitation. Finally, a dispersion liquid in which the quantum dots were re-dispersed not in toluene, but in octane at 80 mg/mL was used as a quantum dot coating liquid.

Step of Forming Quantum Dot Film

First, 1 mL of the quantum dot coating liquid was added dropwise onto the center of the substrate and spin-coated under spin-coating conditions of 2,500 rpm and 30 seconds. The quantum dot film provided by the spin-coating is an oleic-acid-protected quantum dot film (the group of quantum dots protected by oleic acid having a large molecular length).

Subsequently, ligand exchange from oleic acid to a ligand having a small molecular length was performed. As the organic ligand, 1,4-benzenedithiol was used. As the ligand solution for the ligand exchange, a 3 mM 1,4-benzenedithiol solution in N,N-dimethylformamide was used.

The whole surface of the oleic-acid-protected quantum dot film was coated with 20 mL of the ligand solution, to cause the ligand exchange reaction for 30 seconds. Subsequently, the substrate was rotated at 2,000 rpm for 60 seconds to remove the solution to achieve drying. After the ligand exchange, in order to remove an excess of the ligand remaining in the film, rinsing was performed using a solvent in which the ligand was soluble, acetonitrile or methanol. In addition, in order to remove oleic acid having been detached from the quantum dots, rinsing with octane was performed, so that oleic acid in the oleic-acid-protected quantum dot film was detached and exchanged with the predetermined ligand to provide a 1,4-benzenedithiol quantum dot film. At this time, the post-ligand-exchange 1,4-benzenedithiol quantum dot film had a film thickness of 40 nm or more and 60 nm or less.

After the ligand exchange to the organic ligand, ligand exchange procedures similar to the above-described procedures were performed using 20 mL of a mixed solution of lead iodide and the first organic compound in N,N-dimethylformamide (10 mM of lead iodide and 5 mg/mL of the organic compound) to achieve coordination of the iodine ligand to the quantum dots and addition of the first organic compound to the photoelectric conversion layer.

On the post-ligand-exchange quantum dot film (having a thickness of 40 nm to 60 nm), the above-described step of performing formation of an oleic-acid-protected quantum dot film, ligand exchange, addition of the first organic compound, and rinsing was repeated to thereby form an iodine-added 1,4-benzenedithiol quantum dot film having a desired thickness. Note that, in this Example, this step was repeated four times to thereby form a quantum dot film (having a thickness of 200 nm) corresponding to four layers.

Electron Blocking Layer (Second Interfacial Layer)

A vapor deposition apparatus was used under a condition of a chamber pressure of $2.0 \times 10^{-4}$ Pa to form a film of $MoO_3$ having a thickness of 15 nm.

Hole Collection Electrode (Second Electrode)

A sputtering apparatus was used to apply, to an ITO target, conditions of DC 400 V, an argon gas flow rate of 300 sccm, and a chamber pressure of 0.5 Pa to form an ITO film having a thickness of 40 nm.

(2) Evaluation of Photoelectric Conversion Element

The produced element was measured in terms of external quantum efficiency (EQE) and the number of dark electrons. The results will be described in Table 3. The application of voltage and measurement of current were performed using a semiconductor parameter analyzer (4156B, manufactured by Agilent Technologies, Inc.). The irradiation with light was performed using a high-accuracy spectral response measurement system VC-250CA2 manufactured by Bunkoukeiki Co., Ltd.

Figure 7:
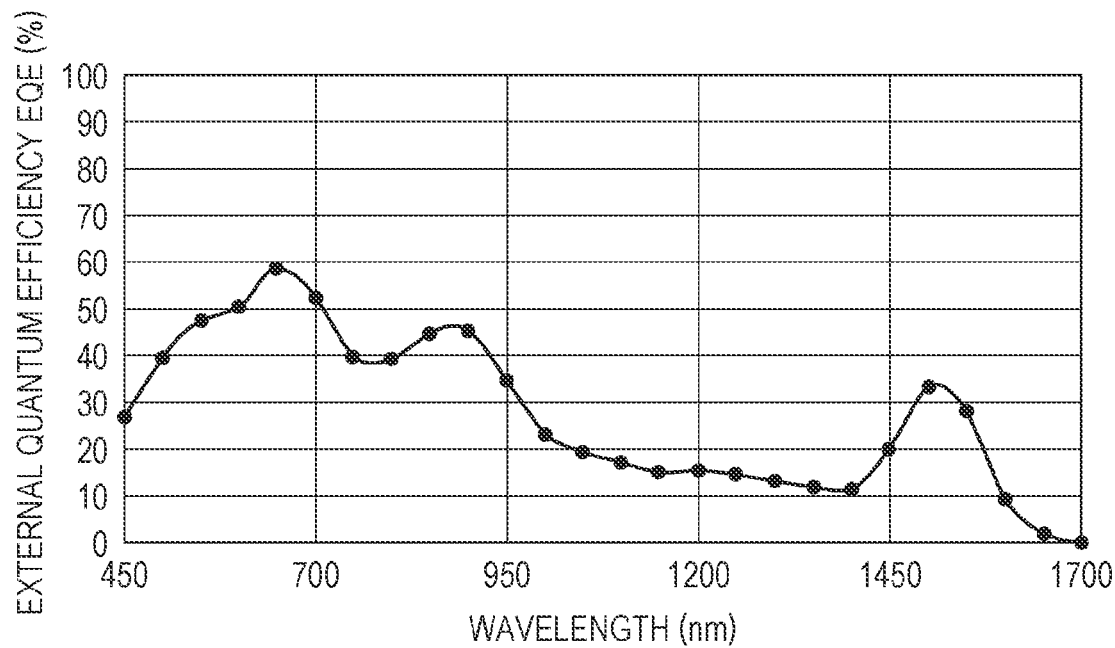
FIG. 7 illustrates an example of the external quantum efficiency of a photoelectric conversion element according to an embodiment.

FIG. 7 illustrates the external quantum efficiency of the photoelectric conversion element produced in this Example.

The number of dark electrons (25° C.) is defined as dark electrons/sec·$\mu m^2$.

The external quantum efficiency and the number of dark electrons were both evaluated at an application voltage of 2 V.

Note that the number of dark electrons was evaluated on the basis of the following ranks; Ranks A or higher were evaluated as Good while Ranks B and C were evaluated as Poor.

AAA: less than 15,000 dark electrons/sec·$\mu m^2$

AA: 15,000 dark electrons/sec·$\mu m^2$ or more and less than 20,000 dark electrons/sec·$\mu m^2$ A: 20,000 dark electrons/sec·$\mu m^2$ or more and less than 50,000 dark electrons/sec·$\mu m^2$ B: 50,000 dark electrons/sec·$\mu m^2$ or more and less than 100,000 dark electrons/sec·$\mu m^2$ C: 100,000 dark electrons/sec·$\mu m^2$ or more Examples 2 to 8 and Comparative Examples 1 to 4

The same procedures as in Example 1 were performed except that the layer configuration was changed as described in Table 3 to perform production and evaluation of photoelectric conversion elements. The results will be described in Table 3. The following are compounds used in Comparative Examples 1 to 3.

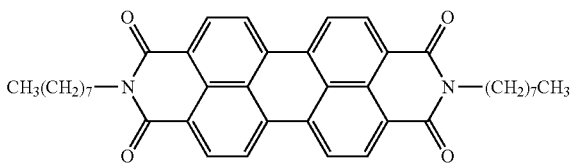

E-7

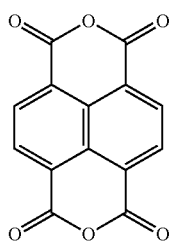

E-8

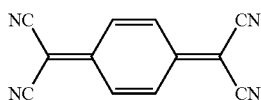

E-9 the quantum dots and the organic compound is suppressed, so that the number of dark electrons is not reduced.

In Comparative Example 3, the organic compound not satisfying Formula (3) is also used and E5≥E4 (4.4 eV). Electrons efficiently move to the organic compound having higher electron affinity than the quantum dots and, subsequently, because of a large difference relative to the electron affinity E3 of the first interfacial layer, electrons accumulate at the interface between the first interfacial layer and the photoelectric conversion layer. Thus, the number of dark electrons is not reduced and the photoelectric conversion efficiency lowers.

In Comparative Example 4, organic compounds are not added and reduction in the number of dark electrons is not observed.

Example 7 is different from Example 6 in the first interfacial layer. In Examples 6 and 7, Formula (4) is satisfied, specifically, E3>E5−0.2; in Example 6, E5>E3, but, in Example 7, E5<E3. Examples 6 and 7 have demonstrated that the difference in the magnitude relation between E5 and E3 does not considerably affect the number of dark electrons.

Example 8 is different from Example 3 in the second interfacial layer. In Example 8, the second interfacial layer

TABLE 3

|  |  | First organic compound | | | | First interfacial layer | | Second interfacial layer | | EQE (1500 nm) [%] | Number of dark electrons |
| --- | --- | --- | --- | --- | --- | --- | --- | --- | --- | --- | --- |
|  |  | Type | E2 [eV] | E5 [eV] | $\mu e_{org1}$ [cm²/Vs] | Type | E3 [eV] | Type | $\mu h_{HTL}$ [cm²/Vs] | | |
| Example | 1 | E-1 | 1.8 | 4.2 | 2.3E−02 | TiO$_2$ | 4.0 | MoO$_3$ | <1E−05 | 34 | AA |
|  | 2 | E-2 | 1.8 | 4.3 | 8.0E−03 | TiO$_2$ | 4.0 | MoO$_3$ | <1E−05 | 30 | A |
|  | 3 | E-3 | 1.8 | 4.2 | 5.0E−02 | TiO$_2$ | 4.0 | MoO$_3$ | <1E−05 | 33 | AA |
|  | 4 | E-4 | 2.3 | 4.2 | 1.3E−04 | TiO$_2$ | 4.0 | MoO$_3$ | <1E−05 | 31 | A |
|  | 5 | E-5 | 2.3 | 4.1 | 6.0E−01 | TiO$_2$ | 4.0 | MoO$_3$ | <1E−05 | 32 | AA |
|  | 6 | E-6 | 1.9 | 4.1 | 2.7E−03 | TiO$_2$ | 4.0 | MoO$_3$ | <1E−05 | 31 | A |
|  | 7 | E-6 | 1.9 | 4.1 | 2.7E−03 | WO$_3$ | 4.16 | MoO$_3$ | <1E−05 | 30 | A |
|  | 8 | E-3 | 1.8 | 4.2 | 5.0E−02 | TiO$_2$ | 4.0 | H-1 | 1.1E−02 | 33 | AAA |
| Comparative Example | 1 | E-7 | 2.4 | 3.9 | 1.0E−02 | TiO$_2$ | 4.0 | MoO$_3$ | <1E−05 | 30 | B |
|  | 2 | E-8 | 4.0 | 3.8 | 1.0E−03 | TiO$_2$ | 4.0 | MoO$_3$ | <1E−05 | 29 | B |
|  | 3 | E-9 | 3.0 | 4.5 | 1.0E−05 | TiO$_2$ | 4.0 | MoO$_3$ | <1E−05 | 15 | C |
|  | 4 | — | — | — | — | TiO$_2$ | 4.0 | MoO$_3$ | <1E−05 | 30 | C |

In Examples 1 to 6, the organic compounds satisfying Formulas (1) and (3) are used and Formula (2) is satisfied. Specifically, Organic compounds E-1 to E-6 satisfy E2>E1 (1.77 eV) and E4 (4.4 eV)−0.4<E5<E4 (4.4 eV) and further satisfy E3<E4 (4.4 eV)−0.2. In each of Examples 1 to 6, the number of dark electrons is evaluated as Rank A or higher. In addition, the photoelectric conversion efficiency (EQE) is increased. In Examples 1 to 6, when the ratio $\mu e_{org}/\mu e_{QD}$ of the electron mobility ($\mu e_{org}$) of the organic compound to the electron mobility ($\mu e_{QD}$) of the quantum dots is high, evaluation ranks in terms of the number of dark electrons tend to become higher.

In Comparative Examples 1 and 2, the organic compounds not satisfying Formula (3) are used and E4 (4.4 eV)−0.4≥E5. There is a large difference between the electron affinity E4 of the quantum dots and the electron affinity E5 of such an organic compound, and electron transfer between is formed of Organic compound H-1 having high hole mobility, so that accumulation of holes at the interface between the photoelectric conversion layer and the second interfacial layer is reduced to improve the hole transport ability, which results in reduction in the number of dark electrons.

Example 9

The same procedures as in Example 3 were performed except that the first organic compound and the second organic compound were mixed together for the photoelectric conversion layer as described in Table 4, to perform production and evaluation of a photoelectric conversion element. The results will be described in Table 4. $Ip_{org2}$ is 5.2 [eV] and $Ip_{QD}$ is 5.3 [eV].

TABLE 4

| | First organic compound | | | | Second organic compound | | | | EQE | |
|---|---|---|---|---|---|---|---|---|---|---|
| | Type | E2 [eV] | E5 [eV] | $\mu e_{org1}$ [cm²/Vs] | Type | E2' [eV] | E5' [eV] | $\mu e_{org2}$ [cm²/Vs] | $\mu h_{org2}$ [cm²/Vs] | (1500 nm) [%] | Number of dark electrons |
| Example 9 | E-3 | 1.8 | 4.2 | 5.0E−02 | H-1 | 3.1 | 2.1 | 1.0E−06 | 1.1E−02 | 33 | AAA |

For the first organic compound and the second organic compound, as described in Table 5, in the coating layers stacked sequentially from the first layer adjacent to the first interfacial layer to the fourth layer, the concentrations of the first and second organic compounds were individually changed.

TABLE 5

| | First organic compound | Second organic compound |
|---|---|---|
| | First organic compound [mg/ml] | Second organic compound [mg/ml] |
| First layer | 5 | 0 |
| Second layer | 3.3 | 1.7 |
| Third layer | 1.7 | 3.3 |
| Fourth layer | 0 | 5 |

In Example 9, in the photoelectric conversion layer, the concentration of the first organic compound increases to the first interfacial layer while the concentration of the second organic compound increases to the second interfacial layer. Positive and negative carriers generated within the photoelectric conversion layer are efficiently transported by the organic compounds to the first interfacial layer and the second interfacial layer, so that the number of dark electrons is reduced.

Embodiments of the present disclosure can provide photoelectric conversion elements in which the dark current is reduced and the electron transport ability is improved to thereby improve the photoelectric conversion efficiency.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-086874, filed May 27, 2022, which is hereby incorporated by reference herein in its entirety.

What is claimed is:

1. A photoelectric conversion element comprising:
a first electrode;
a first interfacial layer;
a photoelectric conversion layer; and
a second electrode disposed in this order,
wherein the photoelectric conversion layer includes quantum dots and a first organic compound,
the first organic compound satisfies Formula (1), and
an electron affinity of a material used for the first interfacial layer, an electron affinity of the quantum dots, and an electron affinity of the first organic compound satisfy Formulas (2) and (3):

$E2>E1$            Formula (1)

where E1 (eV) is an energy at a short-wavelength end of an optical wavelength region detected by the photoelectric conversion element, where E2 (eV) is a band gap of the first organic compound, $E3<E4-0.2$           Formula (2)

$E4-0.4<E5<E4$          Formula (3)

where E3 (eV) is the electron affinity of the material used for the first interfacial layer,
where E4 (eV) is the electron affinity of the quantum dots, and
where E5 (eV) is the electron affinity of the first organic compound.

2. The photoelectric conversion element according to claim 1, wherein the electron affinity E3 of the material used for the first interfacial layer and the electron affinity E5 of the first organic compound satisfy Formula (4):

$E3>E5-0.2$           Formula (4).

3. The photoelectric conversion element according to claim 1, wherein the quantum dots have a band gap of less than 1 eV.

4. The photoelectric conversion element according to claim 1, wherein, when the electron affinity E5 of the first organic compound and the electron affinity E4 of the quantum dots satisfy Formula (5), Formula (6) is satisfied:

$E5<E4-0.2$           Formula (5)

$\mu e_{org1}>\mu e_{QD}$           Formula (6)

where $\mu e_{org1}$ (cm²/Vs) is an electron mobility of the first organic compound in the photoelectric conversion layer, and
where $\mu e_{QD}$ (cm²/Vs) is an electron mobility of the quantum dots in the photoelectric conversion layer.

5. The photoelectric conversion element according to claim 1, wherein the quantum dots include nanoparticles and the nanoparticles contain PbS, PbSe, PbTe, InP, InAs, CdS, CdSe, or CdTe.

6. The photoelectric conversion element according to claim 1, wherein the quantum dots include nanoparticles and surfaces of the nanoparticles are coordinated with at least one organic ligand species selected from the group consisting of 1,4-benzenedithiol and 1,3-benzenedithiol.

7. The photoelectric conversion element according to claim 1, wherein the quantum dots include nanoparticles and, to surfaces of the nanoparticles, at least one halogen selected from the group consisting of iodine, chlorine, and bromine is added.

8. The photoelectric conversion element according to claim 1, wherein the first interfacial layer contains at least one member selected from the group consisting of $TiO_2$, ZnO, $InGaZnO_4$, $MoO_3$, and $WO_3$.

9. The photoelectric conversion element according to claim 1, wherein the first electrode contains titanium or titanium nitride.

10. The photoelectric conversion element according to claim 1, further comprising a second interfacial layer between the photoelectric conversion layer and the second electrode.

11. The photoelectric conversion element according to claim 10, wherein the second interfacial layer contains at least one member selected from the group consisting of $MoO_3$, NiO, and an organic material including a triarylamine moiety or a fluorene moiety.

12. The photoelectric conversion element according to claim 10, wherein a material used for the second interfacial layer and the quantum dots satisfy Formula (7):

$$\mu h_{HTL} > \mu h_{QD} \qquad \text{Formula (7)}$$

where $\mu h_{HTL}$ (cm$^2$/Vs) is a hole mobility of the material used for the second interfacial layer, and where $\mu h_{QD}$ (cm$^2$/Vs) is a hole mobility of the quantum dots in the photoelectric conversion layer.

13. The photoelectric conversion element according to claim 1, wherein the first organic compound contains at least one member selected from the group consisting of fullerene derivative, Perylene tetracarboxylic dianhydride derivative, and hexacosa decaene tetrone derivative.

14. The photoelectric conversion element according to claim 1, wherein the photoelectric conversion layer further includes a second organic compound.

15. The photoelectric conversion element according to claim 14, satisfying Formulas (6) and (8):

$$\mu e_{org1} > \mu e_{QD} \qquad \text{Formula (6)}$$

$$\mu h_{org2} > \mu h_{QD} \qquad \text{Formula (8)}$$

where $\mu e_{org1}$ (cm$^2$/Vs) is an electron mobility of the first organic compound in the photoelectric conversion layer, where $\mu e_{QD}$ (cm$^2$/Vs) is an electron mobility of the quantum dots in the photoelectric conversion layer, where $\mu h_{org2}$ (cm$^2$/Vs) is a hole mobility of the second organic compound in the photoelectric conversion layer, and where $\mu h_{QD}$ (cm$^2$/Vs) is a hole mobility of the quantum dots in the photoelectric conversion layer.

16. The photoelectric conversion element according to claim 14, wherein a concentration of the first organic compound in the photoelectric conversion layer increases to the first interfacial layer, and a concentration of the second organic compound in the photoelectric conversion layer decreases to the first interfacial layer.

17. The photoelectric conversion element according to claim 14, wherein a concentration of the first organic compound in the photoelectric conversion layer is constant, and a concentration of the second organic compound in the photoelectric conversion layer decreases to the first interfacial layer.

18. The photoelectric conversion element according to claim 14, wherein a concentration of the second organic compound in the photoelectric conversion layer is constant, and a concentration of the first organic compound in the photoelectric conversion layer increases to the first interfacial layer.

19. The photoelectric conversion element according to claim 14, wherein the second organic compound contains at least one member selected from the group consisting of the following compounds:

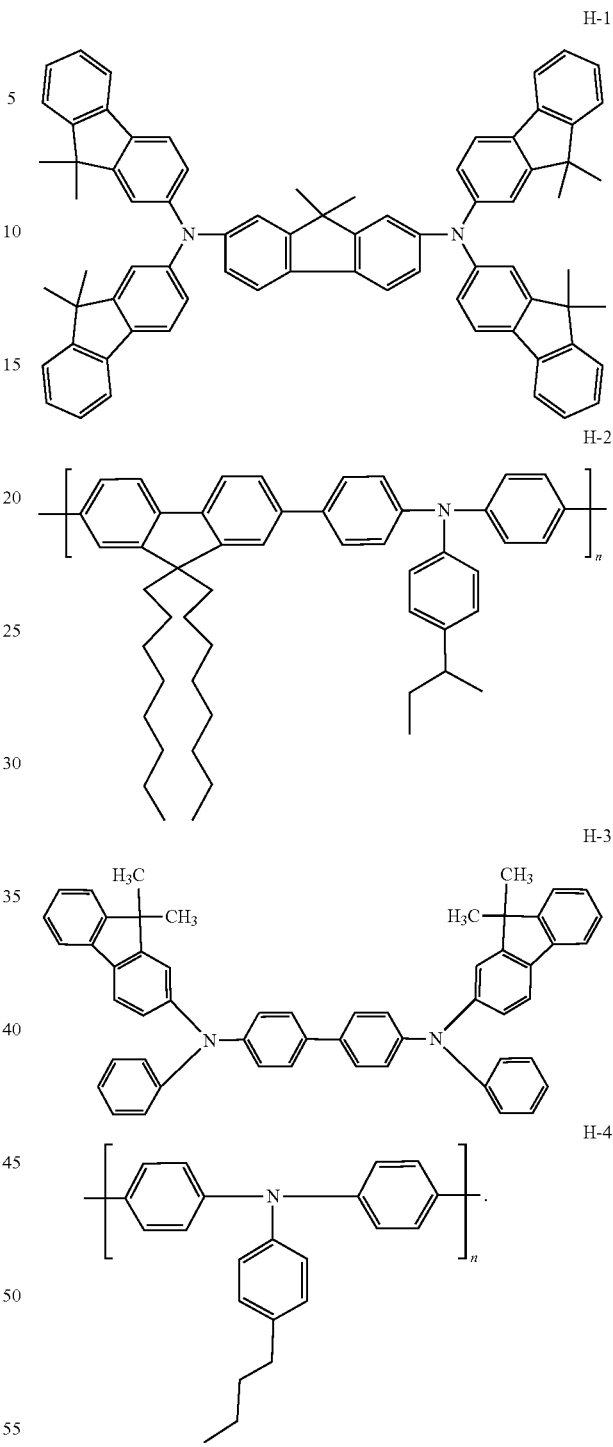

20. The photoelectric conversion element according to claim 1, further comprising, on the first electrode or the second electrode, at least one layer selected from the group consisting of a sealing layer, a lens layer, and a color filter layer.

21. An image sensor comprising a plurality of pixels and a signal processing circuit connected to the pixels, wherein the pixels include the photoelectric conversion element according to claim 1 and a readout circuit connected to the photoelectric conversion element.

22. A light-receiving element comprising the photoelectric conversion element according to claim 1, a readout circuit configured to read out charges from the photoelectric conversion element, and a signal processing circuit configured to receive charges from the readout circuit and to perform signal processing.

23. An image pickup apparatus comprising an optical system including a plurality of lenses and a light-receiving element configured to receive light having been transmitted by the optical system, wherein the light-receiving element includes the photoelectric conversion element according to claim 1.

24. A moving object comprising a body including an image pickup apparatus and a moving unit configured to move the body, wherein the image pickup apparatus is the image pickup apparatus according to claim 23.

* * * * *